(12) United States Patent
Choi et al.

(10) Patent No.: US 10,312,058 B2
(45) Date of Patent: *Jun. 4, 2019

(54) PLASMA UNIFORMITY CONTROL BY GAS DIFFUSER HOLE DESIGN

(71) Applicant: Applied Materials, Inc., Santa Clara, CA (US)

(72) Inventors: Soo Young Choi, Fremont, CA (US); John M. White, Hayward, CA (US); Qunhua Wang, Santa Clara, CA (US); Li Hou, Cupertino, CA (US); Ki Woon Kim, Gumi (KR); Shinichi Kurita, San Jose, CA (US); Tae Kyung Won, San Jose, CA (US); Suhail Anwar, Saratoga, CA (US); Beom Soo Park, San Jose, CA (US); Robin L. Tiner, Santa Cruz, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/719,465

(22) Filed: Sep. 28, 2017

(65) Prior Publication Data

US 2018/0025890 A1 Jan. 25, 2018

Related U.S. Application Data

(63) Continuation of application No. 14/932,618, filed on Nov. 4, 2015, which is a continuation of application
(Continued)

(51) Int. Cl.
*H01J 37/32* (2006.01)
*C23C 16/34* (2006.01)
(Continued)

(52) U.S. Cl.
CPC ........ *H01J 37/3244* (2013.01); *C23C 16/345* (2013.01); *C23C 16/455* (2013.01);
(Continued)

(58) Field of Classification Search
CPC ............ C23C 16/45565; C23C 16/455; C23C 16/5096; C23C 16/345; H01J 37/32082;
(Continued)

(56) References Cited

U.S. PATENT DOCUMENTS 3,830,194 A 8/1974 Benzing et al.
3,854,443 A 12/1974 Baerg
(Continued)

FOREIGN PATENT DOCUMENTS

CN 1501762 6/2004
CN 1696768 A 11/2005
(Continued)

OTHER PUBLICATIONS

"13.56 MHz Hollow Cathode Plasma Source HCD-P 100" Plasma Consult Germany—Technical Note.
(Continued)

*Primary Examiner* — Jeffrie R Lund
(74) *Attorney, Agent, or Firm* — Patterson + Sheridan LLP

(57) ABSTRACT

Embodiments of a method of depositing a thin film on a substrate is provided that includes placing a substrate on a substrate support that is mounted in a processing region of a processing chamber, flowing a process fluid through a plurality of gas passages in a diffuser plate toward the substrate supported on the substrate support, wherein the diffuser plate has an upstream side and a downstream side and the downstream side has a substantially concave curvature, and each of the gas passages are formed between the upstream side and the downstream side, and creating a
(Continued)

plasma between the downstream side of the diffuser plate and the substrate support.

20 Claims, 26 Drawing Sheets

Related U.S. Application Data

No. 13/207,227, filed on Aug. 10, 2011, now Pat. No. 9,200,368, which is a continuation of application No. 10/889,683, filed on Jul. 12, 2004, now Pat. No. 8,083,853.

(60) Provisional application No. 60/570,876, filed on May 12, 2004.

(51) Int. Cl.
  *C23C 16/455* (2006.01)
  *C23C 16/509* (2006.01)

(52) U.S. Cl.
  CPC .... *C23C 16/45565* (2013.01); *C23C 16/5096* (2013.01); *H01J 37/32082* (2013.01); *H01J 37/32091* (2013.01); *H01J 37/32541* (2013.01); *H01J 37/32596* (2013.01); *H01J 2237/327* (2013.01); *H01J 2237/3321* (2013.01); *H01J 2237/3323* (2013.01); *H01J 2237/3325* (2013.01); *Y10T 29/49885* (2015.01); *Y10T 29/49996* (2015.01)

(58) Field of Classification Search
  CPC ............. H01J 37/3244; H01J 37/32091; H01J 37/32541; H01J 37/32596; H01J 2237/3321; H01J 2237/327; H01J 2237/3323; H01J 2237/3325; Y10T 29/49996; Y10T 29/49885
  USPC ............. 118/715, 723 R, 723 E; 156/345.33, 156/345.34, 345.43, 345.47
  See application file for complete search history.

(56) References Cited

U.S. PATENT DOCUMENTS

| | | | |
|---|---|---|---|
| 4,474,358 A | 10/1984 | Bennett et al. |
| 4,491,520 A | 1/1985 | Jaye |
| 4,522,149 A | 6/1985 | Garbis et al. |
| 4,563,367 A | 1/1986 | Sherman |
| 4,726,924 A | 2/1988 | Mittelstadt |
| 4,763,690 A | 8/1988 | Martin |
| 4,780,169 A | 10/1988 | Stark et al. |
| 4,792,378 A | 12/1988 | Rose et al. |
| 4,799,418 A | 1/1989 | Takahashi et al. |
| 4,809,421 A | 3/1989 | Justice |
| 4,854,263 A | 8/1989 | Chang et al. |
| 4,927,991 A | 5/1990 | Wendt et al. |
| 4,993,358 A | 2/1991 | Mahawili |
| 5,000,113 A | 3/1991 | Wang et al. |
| 5,044,943 A | 9/1991 | Bowman et al. |
| 5,124,635 A | 6/1992 | Henley |
| 5,152,504 A | 10/1992 | Nixon et al. |
| 5,173,580 A | 12/1992 | Levin et al. |
| 5,248,371 A | 9/1993 | Maher et al. |
| 5,268,034 A | 12/1993 | Vukelic |
| 5,332,443 A | 7/1994 | Chew et al. |
| 5,339,387 A | 8/1994 | Frankel |
| 5,399,387 A | 3/1995 | Law et al. |
| 5,421,893 A | 6/1995 | Perlov |
| 5,439,524 A | 8/1995 | Cain et al. |
| 5,500,256 A | 3/1996 | Watabe |
| 5,503,809 A | 4/1996 | Coate et al. |
| 5,552,017 A | 9/1996 | Jang et al. |
| 5,567,243 A | 10/1996 | Foster et al. |
| 5,582,866 A | 12/1996 | White |
| 5,611,865 A | 3/1997 | White et al. |
| 5,614,026 A | 3/1997 | Williams |
| 5,614,055 A | 3/1997 | Fairbairn et al. |
| 5,628,829 A | 5/1997 | Foster et al. |
| 5,628,869 A | 5/1997 | Mallon |
| 5,647,911 A | 7/1997 | Vanell et al. |
| 5,714,408 A | 2/1998 | Ichikawa et al. |
| 5,766,364 A | 6/1998 | Ishida et al. |
| 5,819,434 A | 10/1998 | Herchen et al. |
| 5,820,686 A | 10/1998 | Moore |
| 5,844,205 A | 12/1998 | White et al. |
| 5,846,332 A | 12/1998 | Zhao et al. |
| 5,876,838 A | 3/1999 | Mallon |
| 5,882,411 A | 3/1999 | Zhao et al. |
| 5,928,732 A | 7/1999 | Law et al. |
| 5,950,925 A | 9/1999 | Fukunaga et al. |
| 5,968,276 A | 10/1999 | Lei et al. |
| 5,990,016 A | 11/1999 | Kim et al. |
| 5,994,678 A | 11/1999 | Zhao et al. |
| 5,997,649 A | 12/1999 | Hillman |
| 6,024,799 A | 2/2000 | Chen et al. |
| 6,030,508 A | 2/2000 | Yang et al. |
| 6,040,022 A | 3/2000 | Chang et al. |
| 6,041,733 A | 3/2000 | Kim et al. |
| 6,050,506 A | 4/2000 | Guo et al. |
| 6,079,356 A | 6/2000 | Umotoy et al. |
| 6,113,700 A | 9/2000 | Choi et al. |
| 6,123,775 A | 9/2000 | Hao et al. |
| 6,132,512 A | 10/2000 | Horie et al. |
| 6,140,255 A | 10/2000 | Ngo et al. |
| 6,148,765 A | 11/2000 | Lilleland et al. |
| 6,149,365 A | 11/2000 | White et al. |
| 6,150,283 A | 11/2000 | Ishiguro et al. |
| 6,170,432 B1 | 1/2001 | Szapucki et al. |
| 6,176,668 B1 | 1/2001 | Kurita et al. |
| 6,182,602 B1 | 2/2001 | Redeker et al. |
| 6,182,603 B1 | 2/2001 | Shang et al. |
| 6,197,151 B1 | 3/2001 | Kaji et al. |
| 6,203,622 B1 | 3/2001 | Halpin et al. |
| 6,228,438 B1 | 5/2001 | Schmitt et al. |
| 6,232,218 B1 | 5/2001 | Cathey et al. |
| 6,254,742 B1 | 7/2001 | Hanson et al. |
| 6,281,469 B1 | 8/2001 | Perrin et al. |
| 6,302,057 B1 | 10/2001 | Leusink et al. |
| 6,338,874 B1 | 1/2002 | Law et al. |
| 6,344,420 B1 | 2/2002 | Miyajima et al. |
| 6,364,949 B1 | 4/2002 | Or et al. |
| 6,371,712 B1 | 4/2002 | White et al. |
| 6,383,573 B1 | 5/2002 | Beck et al. |
| 6,428,850 B1 | 8/2002 | Shinriki et al. |
| 6,444,040 B1 | 9/2002 | Herchen et al. |
| 6,447,980 B1 | 9/2002 | Rahman et al. |
| 6,454,855 B1 | 9/2002 | Von Kanel et al. |
| 6,454,860 B2 | 9/2002 | Metzner et al. |
| 6,477,980 B1 | 11/2002 | White et al. |
| 6,502,530 B1 | 1/2003 | Turlot et al. |
| 6,527,908 B2 | 3/2003 | Kanetsuki et al. |
| 6,548,112 B1 | 4/2003 | Hillman et al. |
| 6,548,122 B1 | 4/2003 | Sharma et al. |
| 6,556,536 B1 | 4/2003 | Reynolds et al. |
| 6,565,661 B1 | 5/2003 | Nguyen |
| 6,566,186 B1 | 5/2003 | Allman et al. |
| 6,593,548 B2 | 7/2003 | Matsumura et al. |
| 6,596,576 B2 | 7/2003 | Fu et al. |
| 6,599,367 B1 | 7/2003 | Nakatsuka et al. |
| 6,616,766 B2 | 9/2003 | Dunham |
| 6,619,131 B2 | 9/2003 | Walchi et al. |
| 6,626,988 B1 | 9/2003 | Schmalstieg et al. |
| 6,626,998 B1 | 9/2003 | Dunham |
| 6,631,692 B1 | 10/2003 | Matsuki et al. |
| 6,663,025 B1 | 12/2003 | Halsey et al. |
| 6,664,202 B2 | 12/2003 | Tang et al. |
| 6,682,630 B1 | 1/2004 | Colpo et al. |
| 6,683,216 B1 | 1/2004 | Zoeller et al. |
| 6,740,367 B2 | 5/2004 | Matsuki et al. |
| 6,756,324 B1 | 6/2004 | Gates |
| 6,772,827 B2 | 8/2004 | Keller et al. |
| 6,793,733 B2 | 9/2004 | Janakiraman et al. |

(56) References Cited

U.S. PATENT DOCUMENTS

| | | |
|---|---|---|
| 6,814,838 B2 | 11/2004 | Weichart et al. |
| 6,821,347 B2 | 11/2004 | Carpenter et al. |
| 6,852,168 B2 | 2/2005 | Park et al. |
| 6,860,965 B1 | 3/2005 | Stevens |
| 6,873,764 B2 | 3/2005 | Maisenholder et al. |
| 6,881,684 B2 | 4/2005 | Aota et al. |
| 6,916,407 B2 | 7/2005 | Voser et al. |
| 6,918,352 B2 | 7/2005 | Von Kanel et al. |
| 6,924,241 B2 | 8/2005 | Lee |
| 6,942,753 B2 | 9/2005 | Choi et al. |
| 6,961,490 B2 | 11/2005 | Maisenhoelder et al. |
| 7,125,758 B2 | 10/2006 | Choi et al. |
| 7,270,713 B2 | 9/2007 | Blonigan et al. |
| 7,534,301 B2 | 5/2009 | White et al. |
| 8,074,599 B2 | 12/2011 | Choi et al. |
| 8,075,690 B2 | 12/2011 | Keller et al. |
| 8,083,853 B2 | 12/2011 | Choi et al. |
| 8,328,939 B2 | 12/2012 | Choi et al. |
| 8,591,655 B2 | 11/2013 | Masuda et al. |
| 8,721,791 B2 | 5/2014 | Tiner et al. |
| 8,795,793 B2 | 8/2014 | Choi et al. |
| 9,200,368 B2 | 12/2015 | Choi et al. |
| 2001/0021422 A1 | 9/2001 | Yamakoshi et al. |
| 2001/0023742 A1 | 9/2001 | Schmitt |
| 2001/0029892 A1 | 10/2001 | Cook et al. |
| 2002/0006478 A1 | 1/2002 | Yuda et al. |
| 2002/0011215 A1 | 1/2002 | Tei et al. |
| 2002/0129769 A1 | 9/2002 | Kim et al. |
| 2002/0134309 A1 | 9/2002 | Tu et al. |
| 2002/0146879 A1 | 10/2002 | Fu et al. |
| 2002/0174950 A1 | 11/2002 | Park |
| 2002/0189545 A1 | 12/2002 | Matsumura et al. |
| 2003/0089314 A1 | 5/2003 | Matsuki et al. |
| 2003/0143410 A1 | 7/2003 | Won et al. |
| 2003/0170388 A1 | 9/2003 | Shinriki et al. |
| 2003/0199175 A1 | 10/2003 | Tang et al. |
| 2003/0207033 A1 | 11/2003 | Yim et al. |
| 2003/0209323 A1 | 11/2003 | Yokogaki |
| 2004/0003777 A1 | 1/2004 | Carpenter et al. |
| 2004/0043637 A1 | 3/2004 | Aota et al. |
| 2004/0055537 A1 | 3/2004 | Kurita et al. |
| 2004/0060514 A1* | 4/2004 | Janakiraman ......... C23C 16/455 118/715 |
| 2004/0064407 A1 | 4/2004 | Kight et al. |
| 2004/0129211 A1 | 7/2004 | Blonigan et al. |
| 2004/0145383 A1 | 7/2004 | Brunner |
| 2004/0163761 A1* | 8/2004 | Strang ................. H01J 37/3244 156/345.33 |
| 2004/0228141 A1 | 11/2004 | Hay et al. |
| 2004/0250955 A1 | 12/2004 | Blonigan et al. |
| 2005/0000430 A1 | 1/2005 | Jang et al. |
| 2005/0066898 A1 | 3/2005 | Schmitt et al. |
| 2005/0133160 A1 | 6/2005 | Kennedy et al. |
| 2005/0133161 A1 | 6/2005 | Carpenter et al. |
| 2005/0183827 A1 | 8/2005 | White et al. |
| 2005/0196254 A1 | 9/2005 | Kim et al. |
| 2005/0199182 A1 | 9/2005 | Masuda et al. |
| 2005/0223986 A1 | 10/2005 | Choi et al. |
| 2005/0251990 A1 | 11/2005 | Choi et al. |
| 2005/0255257 A1 | 11/2005 | Choi et al. |
| 2006/0005771 A1 | 1/2006 | White et al. |
| 2006/0005926 A1 | 1/2006 | Kang |
| 2006/0054280 A1 | 3/2006 | Jang |
| 2006/0060138 A1 | 3/2006 | Keller et al. |
| 2006/0130764 A1 | 6/2006 | Quan |
| 2006/0228496 A1 | 10/2006 | Choi et al. |
| 2006/0236934 A1 | 10/2006 | Choi et al. |
| 2008/0020146 A1 | 1/2008 | Choi et al. |
| 2008/0305246 A1 | 12/2008 | Choi et al. |
| 2010/0006031 A1 | 1/2010 | Choi et al. |
| 2011/0290183 A1 | 12/2011 | Choi et al. |
| 2014/0053866 A1 | 2/2014 | Baluja et al. |
| 2014/0202388 A1 | 7/2014 | Um |
| 2014/0230730 A1 | 8/2014 | Choi et al. |
| 2014/0246521 A1 | 9/2014 | Tiner et al. |
| 2016/0056019 A1* | 2/2016 | Choi ...................... C23C 16/345 118/723 E |
| 2018/0025890 A1* | 1/2018 | Choi ................. H01J 37/32541 |

FOREIGN PATENT DOCUMENTS

| | | |
|---|---|---|
| EP | 0843348 A2 | 5/1998 |
| EP | 0985742 A2 | 3/2000 |
| EP | 1118693 A2 | 7/2001 |
| EP | 1167570 A1 | 1/2002 |
| EP | 1168427 A1 | 1/2002 |
| EP | 1286386 | 2/2003 |
| EP | 1321538 A2 | 6/2003 |
| EP | 1386981 A1 | 2/2004 |
| EP | 1693880 | 8/2006 |
| JP | 60025235 A | 2/1985 |
| JP | 63187619 A | 8/1988 |
| JP | 01004481 A | 1/1989 |
| JP | 01149964 | 6/1989 |
| JP | 03122281 A | 5/1991 |
| JP | 03122285 | 5/1991 |
| JP | 04-115531 A | 4/1992 |
| JP | H06-216078 A | 8/1994 |
| JP | H07-500459 A | 1/1995 |
| JP | 08055802 A | 2/1996 |
| JP | 08-070035 | 3/1996 |
| JP | 2000-235954 A | 8/2000 |
| JP | 2000-269146 | 9/2000 |
| JP | 2001102309 | 4/2001 |
| JP | 2001164371 | 6/2001 |
| JP | 2001-284271 | 10/2001 |
| JP | 2002-053965 A | 2/2002 |
| JP | 2002064084 A | 2/2002 |
| JP | 2002-299240 A | 10/2002 |
| JP | 2003-179037 | 6/2003 |
| JP | 2004-055895 | 2/2004 |
| JP | 2005086208 A | 3/2005 |
| JP | 2005-317958 A | 11/2005 |
| JP | 2005-347624 A | 12/2005 |
| JP | 2006-513323 A | 4/2006 |
| JP | 2006-120853 A | 5/2006 |
| JP | 2006-120872 A | 5/2006 |
| JP | 2006-515039 A | 5/2006 |
| JP | 2006121057 | 5/2006 |
| KR | 20010077810 | 8/2001 |
| KR | 2007-0039931 A | 4/2007 |
| TW | 1276701 B | 3/2007 |
| TW | 1281838 B | 5/2007 |
| WO | 9533866 A1 | 12/1995 |
| WO | 9925012 A1 | 5/1999 |
| WO | 9925895 A1 | 5/1999 |
| WO | 0183852 A1 | 11/2001 |
| WO | 03002860 A2 | 1/2003 |
| WO | 03015481 A2 | 2/2003 |
| WO | 03078681 A1 | 9/2003 |
| WO | 2004064407 | 7/2004 |
| WO | 2005106917 | 11/2005 |
| WO | 2006017136 A2 | 2/2006 |

OTHER PUBLICATIONS

"13.56 MHz Hollow Cathode Plasma Source HCD-P 300" Plasma Consult Germany—Technical Note.

Anders, et al. "Characterization of Low-Energy Constricted-Plasma Source" Ernest Orlando Lawrence Berkeley National Laboratory & Institute of Physics, Germany (Aug. 1997), pp. 1-11.

Anders, et al. "Working Principle of the Hollow-Anode Plasma Source", Lawrence Berkely National Laboratory, USB, pp. 1-10.

Bardos, et al. "Thin Film Processing By Radio Frequency Hollow Cathodes", Surface and Coatings Technology (1997), pp. 723-728.

EP Search Report for App. # 05000831.7-2122 dated Feb. 16, 2006.

European Office Action dated Feb. 23, 2007 for European Application No. 05000831.7-1215.

Extended European Search Report dated Aug. 30, 2006 for European Application No. 05021902.1.

International Preliminary Report on Patentability dated Jan. 25,

(56) References Cited

OTHER PUBLICATIONS 2007 for International Application No. PCT/US2005/24165.
International Search Report and Written Opinion dated Jul. 19, 2006 for International Application No. PCT/US2005/24165.
International Search Report dated Aug. 11, 2005 for International Application No. PCT/US05/12832.
Kim et al. "A Novel Self-Aligned Coplanar Amorphous Silicon Thin Film Transistor," ISSN0098-0966X/98/2901 (1998).
Korean Notice of Preliminary Rejection dated May 7, 2007 for Korean Application No. 10-2004-0108843.
Korean Office Action dated Aug. 29, 2006 for Korean Application No. 10-2004-0108843.
Korean Office Action dated Oct. 31, 2006 for Korean Application No. 10-2005-87454.
Kuo "Plasma Enhanced Chemical Vapor Deposited Silicon Nitride as a Gate Dielectric Film for Amorphous Silicon Thin Film Transistors—A Critical Review," Vacuum, vol. 51, No. 4, pp. 741-745, Elsevier Science, Ltd., Pergamon Press, Great Britain, Dec. 1998.
Kyung-ha "A Study on Laser Annealed Polycrystalline Silicon Thin Film Transistors (TFTs) with SiNx Gate Insulator," Kyung Hee University, Ch. 2 & 4 (1998).
Lee et al. "High Density Hollow Cathode Plasma Etching for Field Emission Display Applications", Journal of Information Display, vol. 2, No. 4, (2001), pp. 1-7).
Lieberman et al. "Standing wave and skin effects in large-area, high-frequency capacitive discharges", Plasma Sources Sci. Technolo., vol. 11, pp. 283-293 (2002).
Park "Bulk and interface properties of low-temperature silicon nitride films deposited by remote plasma enhanced chemical vapor deposition," Journal of Materials Science: Materials in Electronics, vol. 12, pp. 515-522 (2001).
Partial European Search Report dated May 23, 2006 for European Application No. 05021902.1.
Sazonov et al. "Low Temperature a-Si:H TFT on Plastic Films: Materials and Fabrication Aspects," Proc. 23rd International Conference on Microelectronics (MIEL 2002), vol. 2, Nis, Yugoslvia (May 12-15, 2002).
Third Party Submission for KR 10/2004-0108843, dated Nov. 2006.
Thomasson et al. "High Mobility Tri-Layer a-Si:H Thin Film Transistors with Ultra-Thin Active Layer," IEEE Electron Device Letters, vol. 18, No. 8, Aug. 1997, pp. 397-399.
Office Action for Application 200410082199.3 dated Jun. 15, 2007.
Chinese Office Action dated Jul. 27, 2007 for Chinese Application No. 200510106396.9.
Chinese Office Action dated Jun. 6, 2008 for Chinese Application No. 200510106396.9.
Decision of Patent Examination and Allowance for 9338 KR dated Nov. 30, 2007.
Examiner's ground for rejection dated Sep. 9, 2008 for 9162KRD1.
Korean Office Action dated May 25, 2007.
Official Letter of Taiwan IP office dated Jan. 27, 2005.
Partial Search Report for 9230PCT03 dated Mar. 15, 2006.
Office Action dated Feb. 24, 2009 for European Patent Application No. 05000831.7-1215.
Notice of Reasons for Rejection dated Feb. 17, 2009 for Japanese Patent Application No. 2005-272673.
Office Action dated Dec. 19, 2008 for Chinese Patent Application No. 200580022984.2.
Notice of Reasons for Rejection for Japanese Patent APplication No. P2004-353175 dated Jun. 11, 2009.
Non-final office action for U.S. Appl. No. 11/473,661 dated Jul. 22, 2009.
Final office action for U.S. Appl. No. 11/473,661 dated Mar. 23, 2010.
Office action for European Patent Application No. 05000831.7-1215 dated Mar. 17, 2010.
Office action for Chinese Patent Application No. 2007101669357 dated Feb. 5, 2010.
Office Action for Chinese Patent Application No. 200810099760.7 dated Feb. 5, 2010.
Notice to File a Response for Korean Patent Application No. 10-2008-0053726 dated May 18, 2010.
Chinese office action dated Nov. 3, 2010 for Chinese Patent Application No. 200710166935.7.
Korean office action dated Dec. 10, 2010 for Korean patent application No. 10-2008-0053726.
Taiwan Office Action for application No. 097121591 dated Mar. 24, 2011.
Office Action for Taiwan Patent Application No. 97121591 dated Oct. 4, 2011.
L. Bardos et al., "Thin Film Processing by Radio Frequency Hollow Cathodes", Surface and Coatings Technology 97, (1997), pp. 723-728.
Chinese Office Action dated Jun. 15, 2007 for Chinese Application No. 200410082199.3.
Decision of Patent Examination and Allowance dated Nov. 30, 2007 for Korean Application No. 10-2005-87454.
Taiwan Office Action dated Jun. 4, 2012 for Taiwan Application No. 097121591.
Office Action dated Feb. 19, 2013 for Japanese Patent Application No. 2008-186918.
Notice to File a Response for Korean Patent Application No. 10-2011-0032785 dated Aug. 19, 2013.
Japanese Office Action dated Sep. 18, 2015 for Application No. 2009-212123.
Notice of Reasons for Rejection from JPO dated Jul. 8, 2008.
Preliminary rejection for 9162KR dated Aug. 29, 2006.
Korean Office Action for Patent Application No. 10-2004-0108843, dated Aug. 29, 2006.
European Search Report for Application No. 05000831.-7-2122; dated Feb. 16, 2006.
European Office Action dated Dec. 20, 2007 for European Patent Application No. 05000831.7.
Korean Office Action dated Nov. 22, 2007 for Korean Patent Application No. 10-2007-0079040.
Taiwan Search Report dated Apr. 5, 2007 for Taiwanese Patent Application No. TW 94130602.
European Office Action dated Jun. 12, 2008 for EP Application No. 05764564.0.
Examiner's Grounds for Rejection dated May 25, 2007 for Korean Application No. 10-2005-87454.
Examiner's Grounds for Rejection dated Sep. 9, 2008 for Korean Application No. 10-2007-0079040.
Japanese Notice of Reasons for Rejection dated Jul. 8, 2008 for Japanese Application No. 2004-353175.
Notice to File a Response dated Aug. 29, 2006 for Korean Application No. 10-2004-0108843.
Official Letter dated Jan. 27, 2005 for Taiwan Application No. 93136349.
Partial Search Report dated Mar. 15, 2006 for International Application No. PCT/US2005/024165.

\* cited by examiner

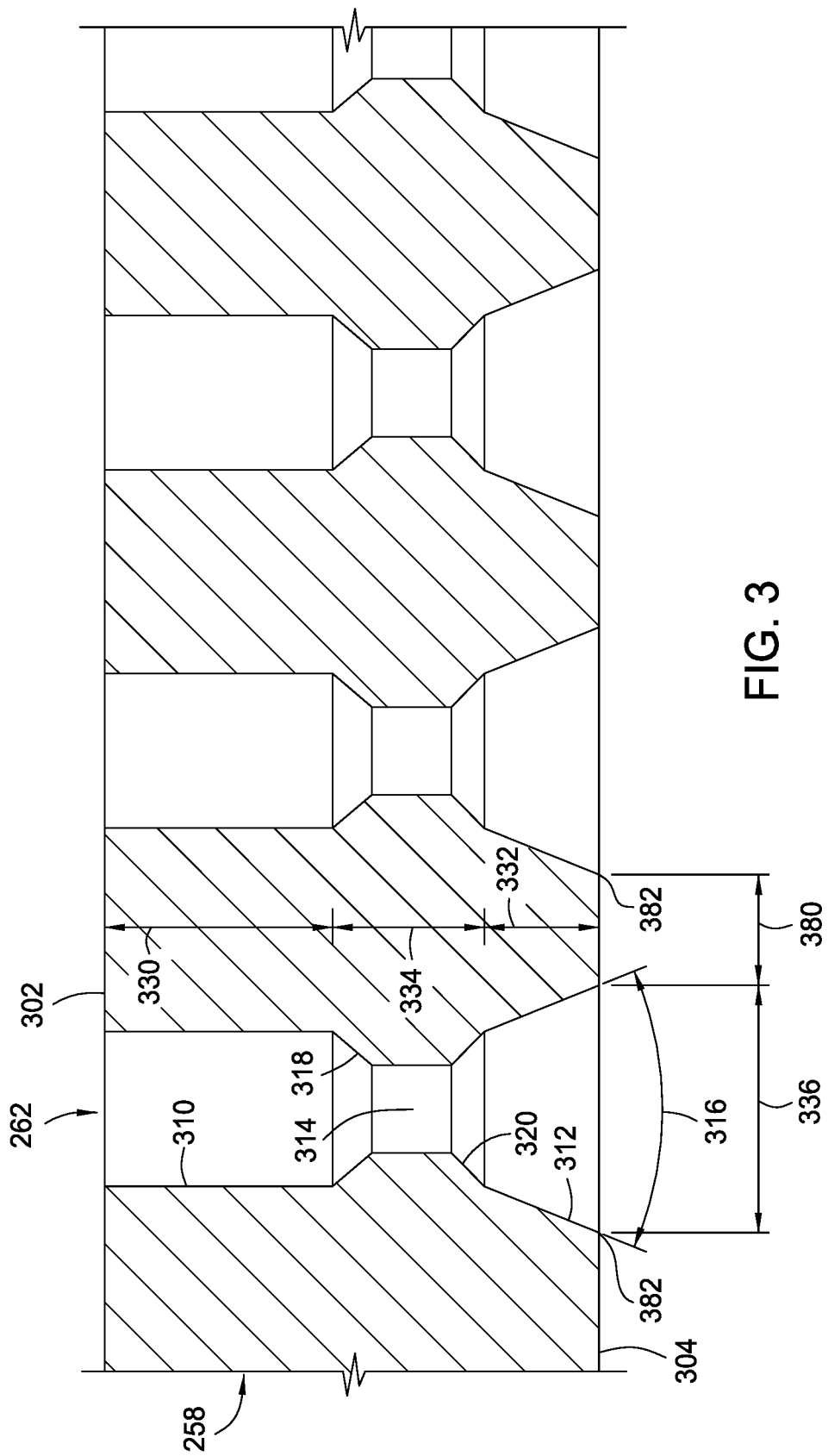

PLASMA UNIFORMITY CONTROL BY GAS DIFFUSER HOLE DESIGN

CROSS-REFERENCE TO OTHER APPLICATIONS

This application is a continuation of U.S. patent application Ser. No. 14/932,618 (APPM/9162C03), filed Nov. 4, 2015, which is a continuation of U.S. patent application Ser. No. 13/207,227 (APPM/9162C02), filed Aug. 10, 2011, which is a continuation of U.S. patent application Ser. No. 10/889,683 (APPM/9162), filed Jul. 12, 2004, which issued as U.S. Pat. No. 8,083,853 on Dec. 27, 2011, which claims benefit of U.S. Provisional Patent Application Ser. No. 60/570,876 (APPM/9162L), filed May 12, 2004. Each of the aforementioned patent applications is herein incorporated by reference.

BACKGROUND OF THE DISCLOSURE

Field of the Invention

Embodiments of the invention generally relate to a gas distribution plate assembly and method for distributing gas in a processing chamber.

Description of the Background Art

Liquid crystal displays or flat panels are commonly used for active matrix displays such as computer and television monitors. Plasma enhanced chemical vapor deposition (PECVD) is generally employed to deposit thin films on a substrate such as a transparent substrate for flat panel display or semiconductor wafer. PECVD is generally accomplished by introducing a precursor gas or gas mixture into a vacuum chamber that contains a substrate. The precursor gas or gas mixture is typically directed downwardly through a distribution plate situated near the top of the chamber. The precursor gas or gas mixture in the chamber is energized (e.g., excited) into a plasma by applying radio frequency (RF) power to the chamber from one or more RF sources coupled to the chamber. The excited gas or gas mixture reacts to form a layer of material on a surface of the substrate that is positioned on a temperature controlled substrate support. Volatile by-products produced during the reaction are pumped from the chamber through an exhaust system.

Flat panels processed by PECVD techniques are typically large, often exceeding 370 mm×470 mm. Large area substrates approaching and exceeding 4 square meters are envisioned in the near future. Gas distribution plates (or gas diffuser plates) utilized to provide uniform process gas flow over flat panels are relatively large in size, particularly as compared to gas distribution plates utilized for 200 mm and 300 mm semiconductor wafer processing.

As the size of substrates continues to grow in the TFT-LCD industry, film thickness and film property uniformity control for large area plasma-enhanced chemical vapor deposition (PECVD) becomes an issue. TFT is one type of flat panel display. The difference of deposition rate and/or film property, such as film stress, between the center and the edge of the substrate becomes significant.

Therefore, there is a need for an improved gas distribution plate assembly that improves the uniformities of film deposition thickness and film properties.

SUMMARY OF THE INVENTION

Embodiments of a gas distribution plate for distributing gas in a processing chamber are provided. In one embodiment, a gas distribution plate assembly for a plasma processing chamber comprises a diffuser plate having an upstream side and a downstream side, and inner and outer gas passages passing between the upstream and downstream sides of the diffuser plate and comprising hollow cathode cavities at the downstream side, wherein the hollow cathode cavity volume density of the inner gas passages are less than the hollow cathode cavity volume density of the outer gas passages.

In another embodiment, a gas distribution plate assembly for a plasma processing chamber comprises a diffuser plate having an upstream side and a downstream side, and inner and outer gas passages passing between the upstream and downstream sides of the diffuser plate and comprising hollow cathode cavities at the downstream side, wherein the hollow cathode cavity surface area density of the inner gas passages are less than the hollow cathode cavity surface area density of the outer gas passages.

In another embodiment, a gas distribution plate assembly for a plasma processing chamber comprises a diffuser plate having an upstream side and a down stream side, and a plurality of gas passages passing between the upstream and downstream sides of the diffuser plate, wherein the densities of hollow cathode cavities gradually increase from the center to the edge of the diffuser plate.

In another embodiment, a plasma processing chamber comprises a diffuser plate having an upstream side and a downstream side, inner and outer gas passages passing between the upstream and downstream sides of the diffuser plate and comprising hollow cathode cavities at the downstream side, wherein the hollow cathode cavity volume density of the inner gas passages are less than the hollow cathode cavity volume density of the outer gas passages, and a substrate support adjacent the downstream side of the diffuser plate.

In another embodiment, a plasma processing chamber comprises a diffuser plate having an upstream side and a downstream side, inner and outer gas passages passing between the upstream and downstream sides of the diffuser plate and comprising hollow cathode cavities at the downstream side, wherein the hollow cathode cavity surface area density of the inner gas passages are less than the hollow cathode cavity surface area density of the outer gas passages, and a substrate support adjacent the downstream side of the diffuser plate.

In another embodiment, a plasma processing chamber comprises a diffuser plate having an upstream side and a down stream side, a plurality of gas passages passing between the upstream and downstream sides of the diffuser plate, wherein the densities of hollow cathode cavities gradually increase from the center to the edge of the diffuser plate, and a substrate support adjacent the downstream side of the diffuser plate.

In another embodiment, a gas distribution plate assembly for a plasma processing chamber comprises a diffuser plate having an upstream side and a down stream side and the gas diffuser plate are divided into a number of concentric zones, and a plurality of gas passages passing between the upstream and downstream sides of the diffuser plate, wherein the gas passages in each zones are identical and the density, the volume, or surface area of hollow cathode cavities of gas passages in each zone gradually increase from the center to the edge of the diffuser plate.

In another embodiment, a method of making a gas diffuser plate for a plasma processing chamber, comprises making a gas diffuser plate to have an upstream side and a down stream side, and a plurality of gas passages passing between the upstream and downstream sides of the diffuser plate, bending the diffuser plate to make it convex smoothly toward downstream side, and machining out the convex surface to flatten the downstream side surface.

In another embodiment, a method of making a gas diffuser plate for a plasma processing chamber comprises machining a gas diffuser plate to have an upstream side and a down stream side, and a plurality of gas passages passing between the upstream and downstream sides of the diffuser plate, wherein densities, volumes or surface area of hollow cathode cavities of the diffuser plate gradually increase from the center to the edge of the diffuser plate.

In another embodiment, a method of depositing a thin film on a substrate comprises placing a substrate in a process chamber with a gas diffuser plate having an upstream side and inner and outer gas passages passing between the upstream and downstream sides of the diffuser plate and comprising hollow cathode cavities at the downstream side, wherein either the hollow cathode cavity volume density, or the hollow cathode cavity surface area density, or the hollow cathode cavity density of the inner gas passages are less than the same parameter of the outer gas passages, flowing process gas(es) through a diffuser plate toward a substrate supported on a substrate support, creating a plasma between the diffuser plate and the substrate support, and depositing a thin film on the substrate in the process chamber.

In another embodiment, a diffuser plate comprises a body having a top surface and a bottom surface, a plurality of gas passages between the top surface the bottom surface, and an outer region and an inner region wherein the body between the top and the bottom of the outer region is thicker than the body between the top and the bottom of the inner region.

In another embodiment, a method of making a gas diffuser plate for a plasma processing chamber comprises making a gas diffuser plate to have an upstream side and a down stream side, and a plurality of gas passages passing between the upstream and downstream sides of the diffuser plate, and machining the downstream surface to make the downstream surface concave.

In yet another embodiment, a method of making a gas diffuser plate for a plasma processing chamber comprises bending a diffuser plate that have an upstream side and a down stream side to make the downstream surface concave and the upstream surface convex, making a plurality of gas passages passing between the upstream and downstream sides of the diffuser plate by making hollow cathode cavities to the same depth from a fictitious flat downstream surface, and making all gas passages to have the same-size orifice holes which are connected to the hollow cathode cavities.

BRIEF DESCRIPTION OF THE DRAWINGS

The teachings of the present invention can be readily understood by considering the following detailed description in conjunction with the accompanying drawings, in which:

FIG. 3 depicts a cross-sectional schematic view of a gas diffuser plate.

To facilitate understanding, identical reference numerals have been used, where possible, to designate identical elements that are common to the figures.

DETAILED DESCRIPTION

The invention generally provides a gas distribution assembly for providing gas delivery within a processing chamber. The invention is illustratively described below in reference to a plasma enhanced chemical vapor deposition system configured to process large area substrates, such as a plasma enhanced chemical vapor deposition (PECVD) system, available from AKT, a division of Applied Materials, Inc., Santa Clara, Calif. However, it should be understood that the invention has utility in other system configurations such as etch systems, other chemical vapor deposition systems and any other system in which distributing gas within a process chamber is desired, including those systems configured to process round substrates.

Figure 1:
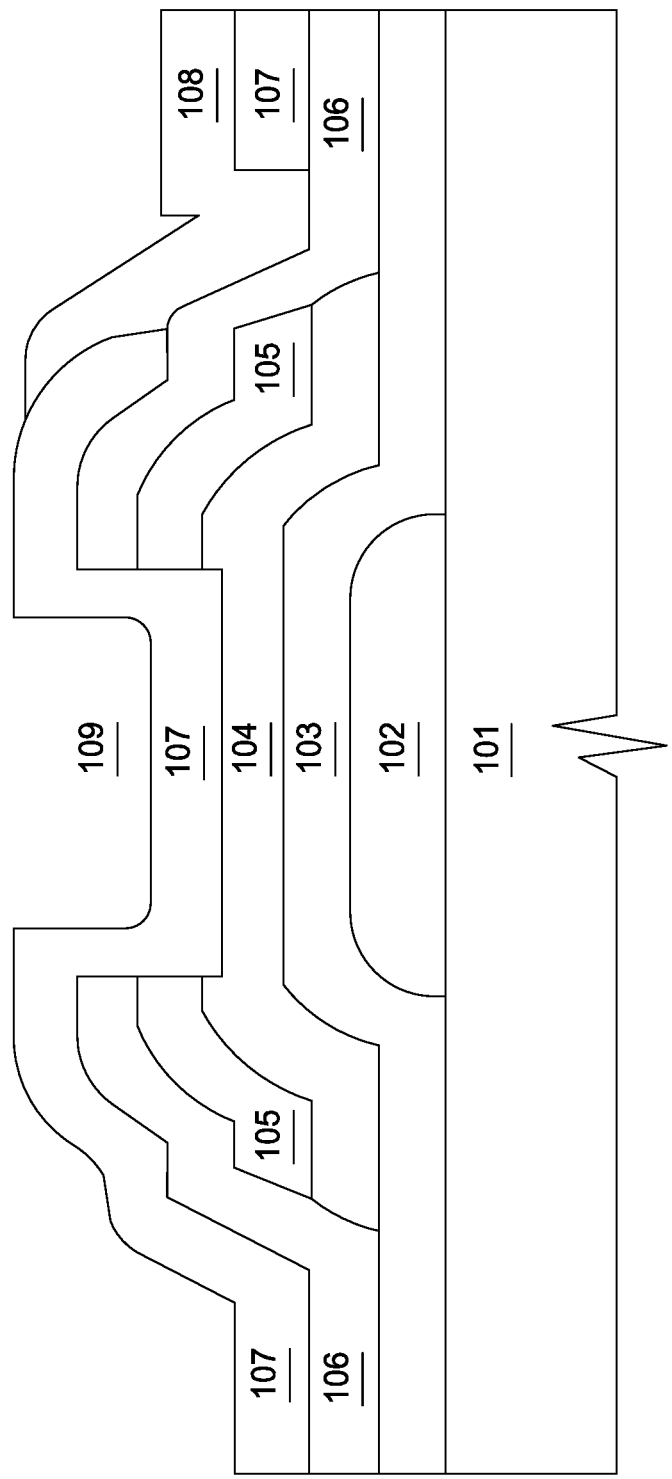
FIG. 1 depicts a cross-sectional schematic view of a bottom gate thin film transistor.

FIG. 1 illustrates cross-sectional schematic views of a thin film transistor structure. A common TFT structure is the back channel etch (BCE) inverted staggered (or bottom gate) TFT structure shown in FIG. 1. The BCE process is preferred, because the gate dielectric (SiN), and the intrinsic as well as n+ doped amorphous silicon films can be deposited in the same PECVD pump-down run. The BCE process shown here involves only 5 patterning masks. The substrate 101 may comprise a material that is essentially optically transparent in the visible spectrum, such as, for example, glass or clear plastic. The substrate may be of varying shapes or dimensions. Typically, for TFT applications, the substrate is a glass substrate with a surface area greater than about 500 mm$^2$. A gate electrode layer 102 is formed on the substrate 101. The gate electrode layer 102 comprises an electrically conductive layer that controls the movement of charge carriers within the TFT. The gate electrode layer 102 may comprise a metal such as, for example, aluminum (Al), tungsten (W), chromium (Cr), tantalum (Ta), or combinations thereof, among others. The gate electrode layer 102 may be formed using conventional deposition, lithography and etching techniques. Between the substrate 101 and the gate electrode layer 102, there may be an optional insulating material, for example, such as silicon dioxide (SiO$_2$) or silicon nitride (SiN), which may also be formed using an embodiment of a PECVD system described in this invention. The gate electrode layer 102 is then lithographically patterned and etched using conventional techniques to define the gate electrode.

A gate dielectric layer 103 is formed on the gate electrode layer 102. The gate dielectric layer 103 may be silicon dioxide (SiO$_2$), silicon oxynitride (SiON), or silicon nitride (SiN), deposited using an embodiment of a PECVD system described in this invention. The gate dielectric layer 103 may be formed to a thickness in the range of about 100 Å to about 6000 Å.

A bulk semiconductor layer 104 is formed on the gate dielectric layer 103. The bulk semiconductor layer 104 may comprise polycrystalline silicon (polysilicon) or amorphous silicon (□-Si), which could be deposited using an embodiment of a PECVD system described in this invention or other conventional methods known to the art. Bulk semiconductor layer 104 may be deposited to a thickness in the range of about 100 Å to about 3000 Å. A doped semiconductor layer 105 is formed on top of the semiconductor layer 104. The doped semiconductor layer 105 may comprise n-type (n+) or p-type (p+) doped polycrystalline (polysilicon) or amorphous silicon (□-Si), which could be deposited using an embodiment of a PECVD system described in this invention or other conventional methods known to the art. Doped semiconductor layer 105 may be deposited to a thickness within a range of about 100 Å to about 3000 Å. An example of the doped semiconductor layer 105 is n+ doped □-Si film. The bulk semiconductor layer 104 and the doped semiconductor layer 105 are lithographically patterned and etched using conventional techniques to define a mesa of these two films over the gate dielectric insulator, which also serves as storage capacitor dielectric. The doped semiconductor layer 105 directly contacts portions of the bulk semiconductor layer 104, forming a semiconductor junction.

A conductive layer 106 is then deposited on the exposed surface. The conductive layer 106 may comprise a metal such as, for example, aluminum (Al), tungsten (W), molybdenum (Mo), chromium (Cr), tantalum (Ta), and combinations thereof, among others. The conductive layer 106 may be formed using conventional deposition techniques. Both the conductive layer 106 and the doped semiconductor layer 105 may be lithographically patterned to define source and drain contacts of the TFT. Afterwards, a passivation layer 107 may be deposited. Passivation layer 107 conformably coats exposed surfaces. The passivation layer 107 is generally an insulator and may comprise, for example, silicon dioxide (SiO$_2$) or silicon nitride (SiN). The passivation layer 107 may be formed using, for example, PECVD or other conventional methods known to the art. The passivation layer 107 may be deposited to a thickness in the range of about 1000 Å to about 5000 Å. The passivation layer 107 is then lithographically patterned and etched using conventional techniques to open contact holes in the passivation layer.

A transparent conductor layer 108 is then deposited and patterned to make contacts with the conductive layer 106. The transparent conductor layer 108 comprises a material that is essentially optically transparent in the visible spectrum and is electrically conductive. Transparent conductor layer 108 may comprise, for example, indium tin oxide (ITO) or zinc oxide, among others. Patterning of the transparent conductive layer 108 is accomplished by conventional lithographical and etching techniques.

The doped or un-doped (intrinsic) amorphous silicon (□-Si), silicon dioxide (SiO2), silicon oxynitride (SiON) and silicon nitride (SiN) films used in liquid crystal displays (or flat panels) could all be deposited using an embodiment of a plasma enhanced chemical vapor deposition (PECVD) system described in this invention. The TFT structure described here is merely used as an example. The current invention applies to manufacturing any devices that are applicable.

Figure 2:
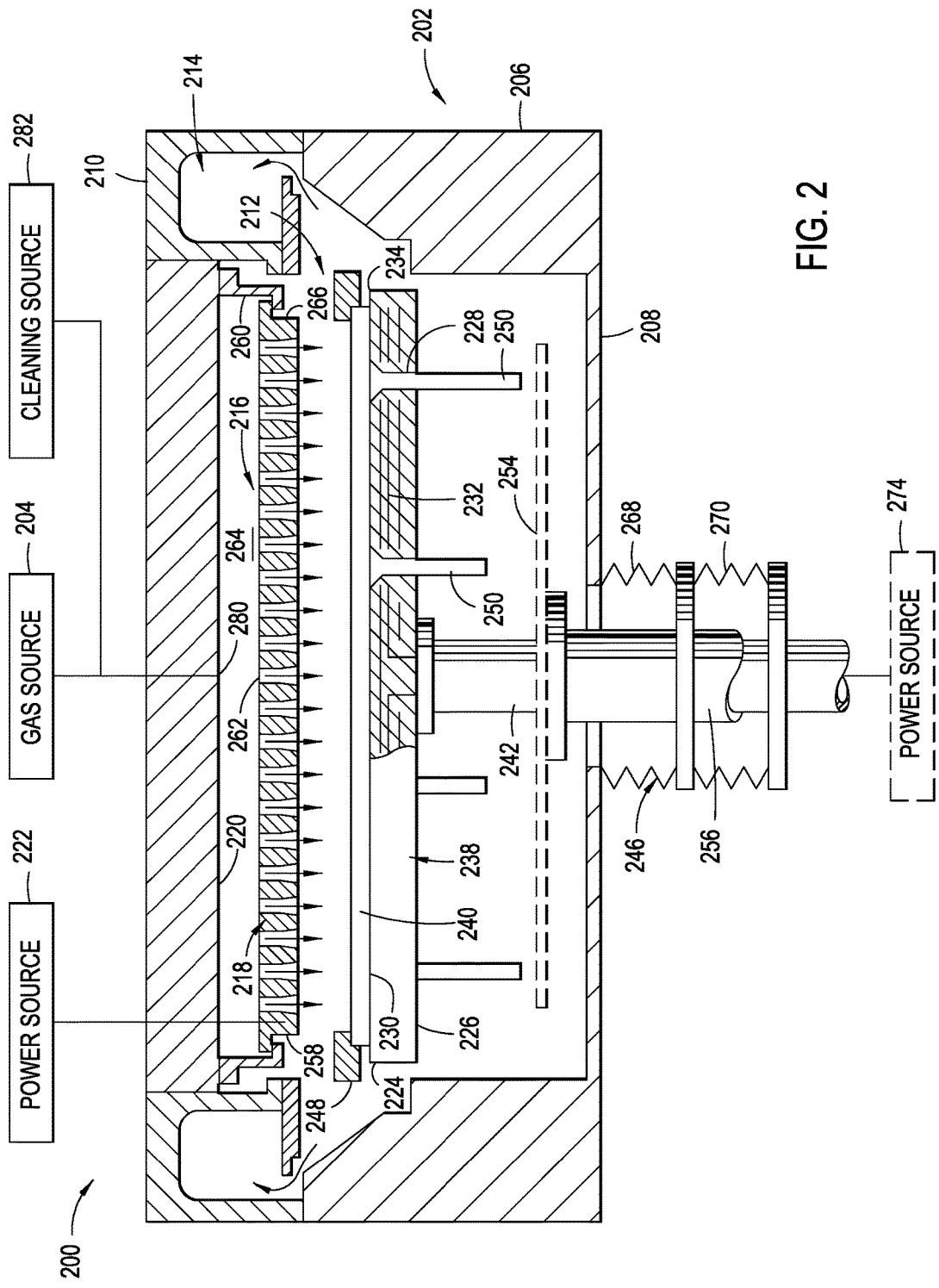
FIG. 2 is a schematic cross-sectional view of an illustrative processing chamber having one embodiment of a gas distribution plate assembly of the present invention.

FIG. 2 is a schematic cross-sectional view of one embodiment of a plasma enhanced chemical vapor deposition system 200, available from AKT, a division of Applied Materials, Inc., Santa Clara, Calif. The system 200 generally includes a processing chamber 202 coupled to a gas source 204. The processing chamber 202 has walls 206 and a bottom 208 that partially define a process volume 212. The process volume 212 is typically accessed through a port (not shown) in the walls 206 that facilitate movement of a substrate 240 into and out of the processing chamber 202. The walls 206 and bottom 208 are typically fabricated from a unitary block of aluminum or other material compatible with processing. The walls 206 support a lid assembly 210 that contains a pumping plenum 214 that couples the process volume 212 to an exhaust port (that includes various pumping components, not shown).

A temperature controlled substrate support assembly 238 is centrally disposed within the processing chamber 202. The support assembly 238 supports a glass substrate 240 during processing. In one embodiment, the substrate support assembly 238 comprises an aluminum body 224 that encapsulates at least one embedded heater 232. The heater 232, such as a resistive element, disposed in the support assembly 238, is coupled to an optional power source 274 and controllably heats the support assembly 238 and the glass substrate 240 positioned thereon to a predetermined temperature. Typically, in a CVD process, the heater 232 maintains the glass substrate 240 at a uniform temperature between about 150 to at least about 460 degrees Celsius, depending on the deposition processing parameters for the material being deposited.

Generally, the support assembly 238 has a lower side 226 and an upper side 234. The upper side 234 supports the glass substrate 240. The lower side 226 has a stem 242 coupled thereto. The stem 242 couples the support assembly 238 to a lift system (not shown) that moves the support assembly 238 between an elevated processing position (as shown) and a lowered position that facilitates substrate transfer to and from the processing chamber 202. The stem 242 additionally provides a conduit for electrical and thermocouple leads between the support assembly 238 and other components of the system 200.

A bellows 246 is coupled between support assembly 238 (or the stem 242) and the bottom 208 of the processing chamber 202. The bellows 246 provides a vacuum seal between the chamber volume 212 and the atmosphere outside the processing chamber 202 while facilitating vertical movement of the support assembly 238.

The support assembly 238 generally is grounded such that RF power supplied by a power source 222 to a gas distribution plate assembly 218 positioned between the lid assembly 210 and substrate support assembly 238 (or other electrode positioned within or near the lid assembly of the chamber) may excite gases present in the process volume 212 between the support assembly 238 and the distribution plate assembly 218. The RF power from the power source 222 is generally selected commensurate with the size of the substrate to drive the chemical vapor deposition process.

The support assembly 238 additionally supports a circumscribing shadow frame 248. Generally, the shadow frame 248 prevents deposition at the edge of the glass substrate 240 and support assembly 238 so that the substrate does not stick to the support assembly 238. The support assembly 238 has a plurality of holes 228 disposed therethrough that accept a plurality of lift pins 250. The lift pins 250 are typically comprised of ceramic or anodized aluminum. The lift pins 250 may be actuated relative to the support assembly 238 by an optional lift plate 254 to project from the support surface 230, thereby placing the substrate in a spaced-apart relation to the support assembly 238.

The lid assembly 210 provides an upper boundary to the process volume 212. The lid assembly 210 typically can be removed or opened to service the processing chamber 202. In one embodiment, the lid assembly 210 is fabricated from aluminum (Al). The lid assembly 210 includes a pumping plenum 214 formed therein coupled to an external pumping system (not shown). The pumping plenum 214 is utilized to channel gases and processing by-products uniformly from the process volume 212 and out of the processing chamber 202.

The lid assembly 210 typically includes an entry port 280 through which process gases provided by the gas source 204 are introduced into the processing chamber 202. The entry port 280 is also coupled to a cleaning source 282. The cleaning source 282 typically provides a cleaning agent, such as dissociated fluorine, that is introduced into the processing chamber 202 to remove deposition by-products and films from processing chamber hardware, including the gas distribution plate assembly 218.

The gas distribution plate assembly 218 is coupled to an interior side 220 of the lid assembly 210. The gas distribution plate assembly 218 is typically configured to substantially follow the profile of the glass substrate 240, for example, polygonal for large area flat panel substrates and circular for wafers. The gas distribution plate assembly 218 includes a perforated area 216 through which process and other gases supplied from the gas source 204 are delivered to the process volume 212. The perforated area 216 of the gas distribution plate assembly 218 is configured to provide uniform distribution of gases passing through the gas distribution plate assembly 218 into the processing chamber 202. Gas distribution plates that may be adapted to benefit from the invention are described in commonly assigned U.S. patent application Ser. No. 09/922,219, filed Aug. 8, 2001 by Keller et al., U.S. patent application Ser. No. 10/140,324, filed May 6, 2002 by Yim et al., and Ser. No. 10/337,483, filed Jan. 7, 2003 by Blonigan et al., U.S. Pat. No. 6,477,980, issued Nov. 12, 2002 to White et al., U.S. patent application Ser. No. 10/417,592, filed Apr. 16, 2003 by Choi et al., and U.S. patent application Ser. No. 10/823,347, filed on Apr. 12, 2004 by Choi et al., which are hereby incorporated by reference in their entireties.

The gas distribution plate assembly 218 typically includes a diffuser plate (or distribution plate) 258 suspended from a hanger plate 260. The diffuser plate 258 and hanger plate 260 may alternatively comprise a single unitary member. A plurality of gas passages 262 are formed through the diffuser plate 258 to allow a predetermined distribution of gas passing through the gas distribution plate assembly 218 and into the process volume 212. The hanger plate 260 maintains the diffuser plate 258 and the interior surface 220 of the lid assembly 210 in a spaced-apart relation, thus defining a plenum 264 therebetween. The plenum 264 allows gases flowing through the lid assembly 210 to uniformly distribute across the width of the diffuser plate 258 so that gas is provided uniformly above the center perforated area 216 and flows with a uniform distribution through the gas passages 262.

The diffuser plate 258 is typically fabricated from stainless steel, aluminum (Al), anodized aluminum, nickel (Ni) or other RF conductive material. The diffuser plate 258 could be cast, brazed, forged, hot iso-statically pressed or sintered. The diffuser plate 258 is configured with a thickness that maintains sufficient flatness across the aperture 266 as not to adversely affect substrate processing. The thickness of the diffuser plate 258 is between about 0.8 inch to about 2.0 inches. The diffuser plate 258 could be circular for semiconductor wafer manufacturing or polygonal, such as rectangular, for flat panel display manufacturing.

FIG. 3 is a partial sectional view of an exemplary diffuser plate 258 that is described in commonly assigned U.S. patent application Ser. No. 10/417,592, titled "Gas Distribution Plate Assembly for Large Area Plasma Enhanced Chemical Vapor Deposition", filed on Apr. 16, 2003. The diffuser plate 258 includes a first or upstream side 302 facing the lid assembly 210 and an opposing second or downstream side 304 that faces the support assembly 238. Each gas passage 262 is defined by a first bore 310 coupled by an orifice hole 314 to a second bore 312 that combine to form a fluid path through the gas distribution plate 258. The first bore 310 extends a first depth 330 from the upstream side 302 of the gas distribution plate 258 to a bottom 318. The bottom 318 of the first bore 310 may be tapered, beveled, chamfered or rounded to minimize the flow restriction as gases flow from the first bore into the orifice hole 314. The first bore 310 generally has a diameter of about 0.093 to about 0.218 inches, and in one embodiment is about 0.156 inches.

The second bore 312 is formed in the diffuser plate 258 and extends from the downstream side (or end) 304 to a depth 332 of about 0.10 inch to about 2.0 inches. Preferably, the depth 332 is between about 0.1 inch to about 1.0 inch. The diameter 336 of the second bore 312 is generally about 0.1 inch to about 1.0 inch and may be flared at an angle 316 of about 10 degrees to about 50 degrees. Preferably, the diameter 336 is between about 0.1 inch to about 0.5 inch and the flaring angle 316 is between 20 degrees to about 40 degrees. The surface of the second bore 312 is between about 0.05 inch$^2$ to about 10 inch$^2$ and preferably between about 0.05 inch$^2$ to about 5 inch$^2$. The diameter of second bore 312 refers to the diameter intersecting the downstream surface 304. An example of diffuser plate, used to process 1500 mm by 1850 mm substrates, has second bores 312 at a diameter of 0.250 inch and at a flare angle 316 of about 22 degrees. The distances 380 between rims 382 of adjacent second bores 312 are between about 0 inch to about 0.6 inch, preferably between about 0 inch to about 0.4 inch. The diameter of the first bore 310 is usually, but not limited to, being at least equal to or smaller than the diameter of the second bore 312. A bottom 320 of the second bore 312 may be tapered, beveled, chamfered or rounded to minimize the pressure loss of gases flowing out from the orifice hole 314 and into the second bore 312. Moreover, as the proximity of the orifice hole 314 to the downstream side 304 serves to minimize the exposed surface area of the second bore 312 and the downstream side 304 that face the substrate, the downstream area of the diffuser plate 258 exposed to fluorine provided during chamber cleaning is reduced, thereby reducing the occurrence of fluorine contamination of deposited films.

The orifice hole 314 generally couples the bottom 318 of the first hole 310 and the bottom 320 of the second bore 312. The orifice hole 314 generally has a diameter of about 0.01 inch to about 0.3 inch, preferably about 0.01 inch to about 0.1 inch, and typically has a length 334 of about 0.02 inch to about 1.0 inch, preferably about 0.02 inch to about 0.5 inch. The length 334 and diameter (or other geometric attribute) of the orifice hole 314 is the primary source of back pressure in the plenum 264 which promotes even distribution of gas across the upstream side 302 of the gas distribution plate 258. The orifice hole 314 is typically configured uniformly among the plurality of gas passages 262; however, the restriction through the orifice hole 314 may be configured differently among the gas passages 262 to promote more gas flow through one area of the gas distribution plate 258 relative to another area. For example, the orifice hole 314 may have a larger diameter and/or a shorter length 334 in those gas passages 262, of the gas distribution plate 258, closer to the wall 206 of the processing chamber 202 so that more gas flows through the edges of the perforated area 216 to increase the deposition rate at the perimeter of the glass substrate. The thickness of the diffuser plate is between about 0.8 inch to about 3.0 inches, preferably between about 0.8 inch to about 2.0 inch.

As the size of substrate continues to grow in the TFT-LCD industry, especially, when the substrate size is at least about 1000 mm by about 1200 mm (or about 1,200,000 mm$^2$), film thickness and property uniformity for large area plasma-enhanced chemical vapor deposition (PECVD) becomes more problematic. Examples of noticeable uniformity problems include higher deposition rates and more compressive films in the central area of large substrates for some high deposition rate silicon nitride films. The thickness uniformity across the substrate appears "dome shaped" with film in center region thicker than the edge region. The less compressive film in the edge region has higher Si—H content. The manufacturing requirements for TFT-LCD include low Si—H content, for example <15 atomic %, high deposition rate, for example >1500 Å/min, and low thickness non-uniformity, for example <15%, across the substrate. The Si—H content is calculated from FTIR (Fourier Transform Infra-Red) measurement. The larger substrates have worse "dome shape" uniformity issue. The problem could not be eliminated by process recipe modification to meet all requirements. Therefore, the issue needs to be addressed by modifying the gas and/or plasma distribution.

Figure 4A:
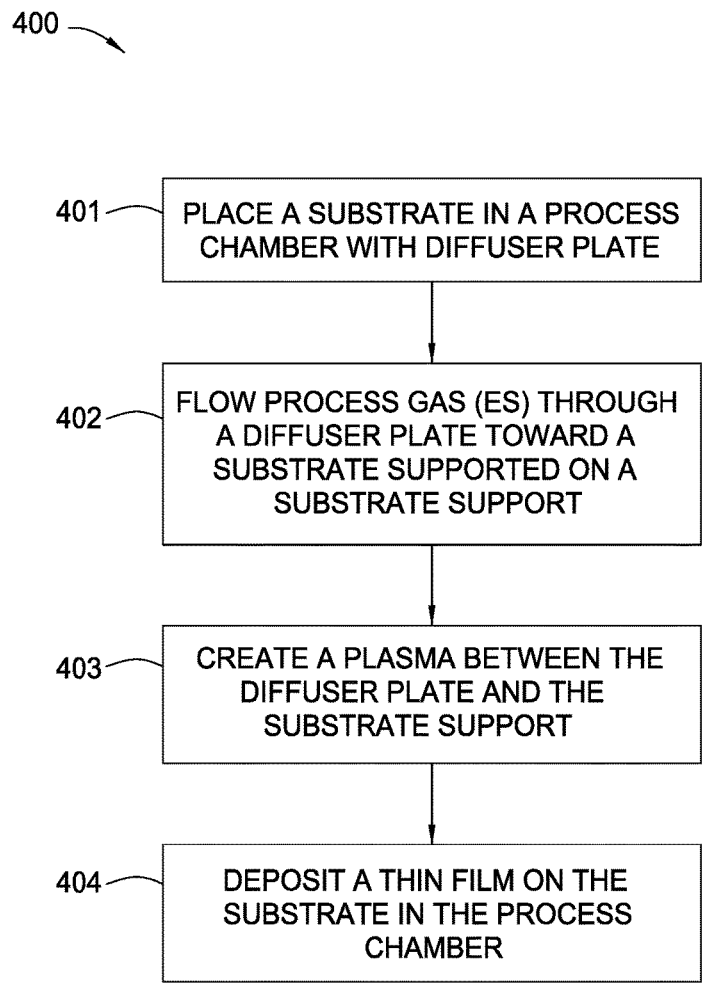
FIG. 4A shows the process flow of depositing a thin film on a substrate in a process chamber with a diffuser plate.
Figure 4B:
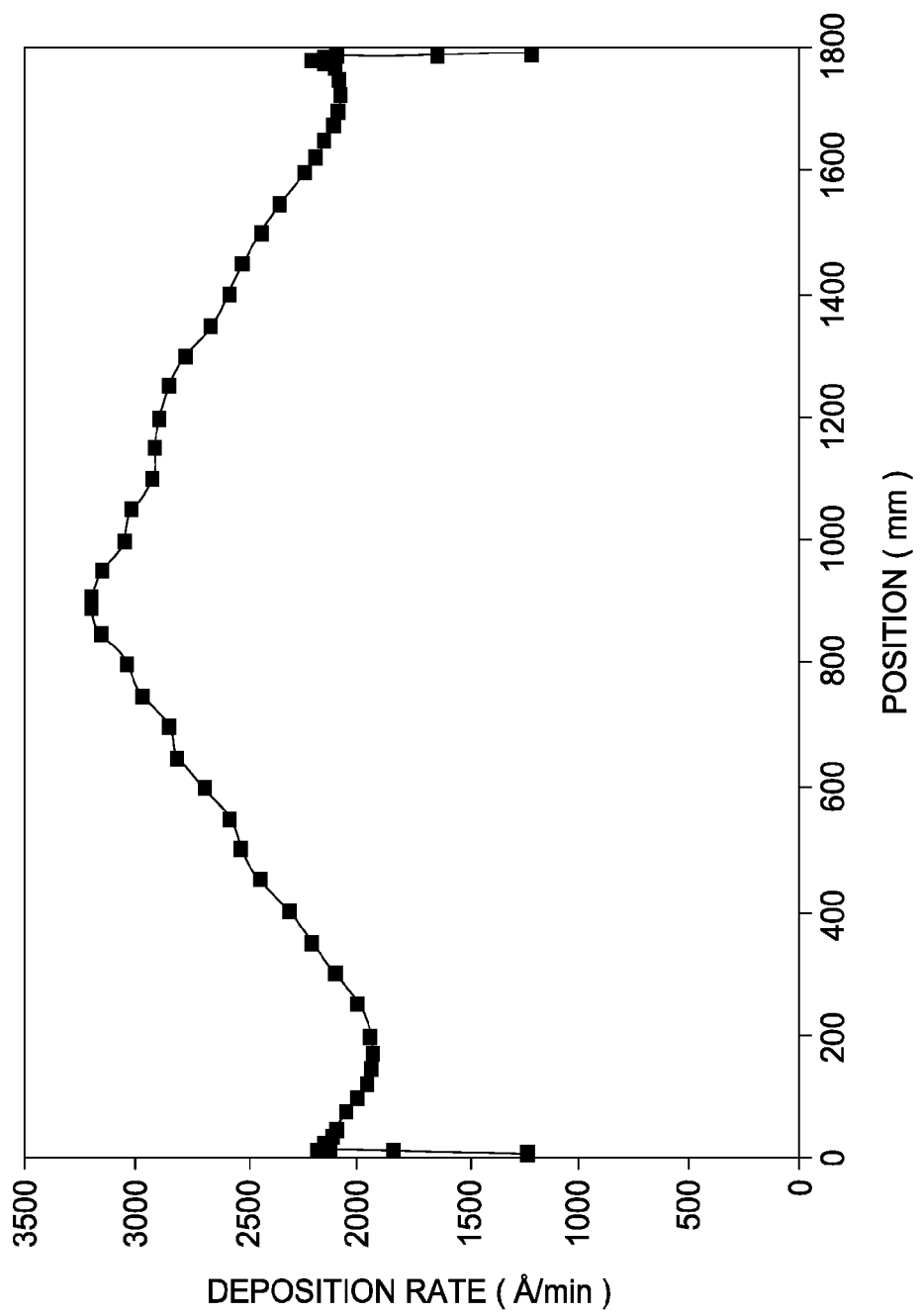
FIG. 4B shows the deposition rate measurement across a 1500 mm by 1800 mm substrate collected from deposition with a diffuser plate with uniform diffuser holes diameters and depths.

The process of depositing a thin film in a process chamber is shown in FIG. 4A. The process starts at step 401 by placing a substrate in a process chamber with a diffuser plate. Next at step 402, flow process gas(es) through a diffuser plate toward a substrate supported on a substrate support. Then at step 403, create a plasma between the diffuser plate and the substrate support. At step 404, deposit a thin film on the substrate in the process chamber. FIG. 4B shows a thickness profile of a silicon nitride film across a glass substrate. The size of the substrate is 1500 mm by 1800 mm. The diffuser plate has diffuser holes with design shown in FIG. 3. The diameter of the first bore 310 is 0.156 inch. The length 330 of the first bore 310 is 1.049 inch. The diameter 336 of the second bore 312 is 0.250 inch. The flaring angle 316 of the second bore 312 is 22 degree. The length 332 of the second bore 312 is 0.243 inch. The diameter of the orifice hole 314 is 0.016 inch and the length 334 of the orifice hole 314 is 0.046 inch. The SiN film is deposited using 2800 sccm SiH$_4$, 9600 sccm NH$_3$ and 28000 sccm N$_2$, under 1.5 Torr, and 15000 watts source power. The spacing between the diffuser plate and the support assembly is 1.05 inch. The process temperature is maintained at about 355° C. The deposition rate is averaged to be 2444 Å/min and the thickness uniformity (with 15 mm edge exclusion) is 25.1%, which is higher than the manufacturing specification (<15%). The thickness profile shows a center thick profile, or "dome shape" profile. Table 1 shows the film properties measured from wafers placed on the glass substrate for the above film.

TABLE 1

Measurement of thickness and film properties on a substrate deposited with SiN film.

| Measurement location | Thickness (Å) | RI | Stress (E9 Dynes/cm$^2$) | Si-H (atomic %) | WER (Å/min) |
|---|---|---|---|---|---|
| Edge I | 5562 | 1.92 | −0.7 | 12.5 | 664 |
| Center | 8544 | 1.90 | −6.7 | 4.2 | 456 |
| Edge II | 6434 | 1.91 | −1.2 | 10.8 | 665 |

Edge I and Edge II represent two extreme ends of the substrate with width at 1800 mm. The refractive index (RI), film stress, Si—H concentration data and wet etch rate (WER) data show a more compressive film near the center region in comparison to the edge region. The Si—H concentrations at the substrate edges are approaching the manufacturing limit of 15%. Wet etch rate is measured by immersing the samples in a BOE (buffered oxide etch) 6:1 solution.

Figure 5:
FIG. 5 shows 2 sides (501 and 502) of the substrate that are close to the sides with pumping channels closed and the 5 measurement locations on a substrate.

One theory for the cause of the center to edge non-uniformity problem is excess residual gas between diffuser plate and substrate and in the center region of the substrate that could not be pumped away effectively, which may have caused high deposition rate and more compressive film in the center region of the substrate. A simple test has been designed to see if this theory would stand. As shown in FIG. 5, a thermo-resistant tape is used to block of the pumping channels 214 (shown in FIG. 2) near side 501 and side 502 of substrate in a PECVD process chamber. The pumping channels 214 near the other two sides are left open. Due to this, an asymmetric gas pumping situation was created. If the cause of the "dome shape" problem is due to excess residual gas that could not be pumped away at the edge of the substrate, the use of thermo-resistant tape near two edges of the substrate should worsen the uniformity issue and cause worse uniformity across the substrate. However, little changes has been observed comparing the deposition results between deposition done with 2 pumping channels blocked and deposition with all pumping channel opened (see Table 2). The diffuser plate used here has the same design and dimensions as the one used for FIG. 4B and Table 1. The SiN films in Table 2 are deposited using 3300 sccm SiH$_4$, 28000 sccm NH$_3$ and 18000 sccm N$_2$, under 1.3 Torr, and 11000 watts source power. The spacing between the diffuser plate and the support assembly is 0.6 inch. The process temperature is maintained at about 355° C. Film thickness and properties are measured on location 1, 2, 3, 4 and 5 (as shown in FIG. 5) on the substrates. The SiH content shown is Table 2 is measured in atomic %.

TABLE 2

SiN thickness and film properties comparison between deposition with all pumping channels open and with 2 pumping channels closed.

| | All pumping channels open | | | | 2 pumping channels blocked | | | |
|---|---|---|---|---|---|---|---|---|
| Position | Thickness (Å) | RI | Stress (E9 dynes/cm$^2$) | SiH (%) | Thickness (Å) | RI | Stress (E9 dynes/cm$^2$) | SiH (%) |
| 1 | 6156 | 1.92 | −4.6 | 11.1 | 5922 | 1.93 | −3.9 | 11.5 |
| 2 | 7108 | 1.91 | −5.1 | 8.8 | 7069 | 1.92 | −5.1 | 9.1 |
| 3 | 7107 | 1.91 | −5.1 | 8.5 | 7107 | 1.91 | −4.8 | 8.9 |
| 4 | 7052 | 1.91 | −5.0 | 8.1 | 7048 | 1.91 | −4.6 | 8.5 |
| 5 | 6173 | 1.92 | −4.2 | 10.8 | 6003 | 1.92 | −3.8 | 11.2 |

The results in Table 2 show little difference between the deposition done with 2 pumping channels blocked and deposition with all pumping channel opened. In addition, there is little difference between measurement collected at locations 1 and 5, which should be different if residual gas is the cause of the problem. Therefore, the theory of excess residual gas between diffuser and substrate and in the center region of the substrate not being pumped away effectively is ruled out.

Figure 6A:
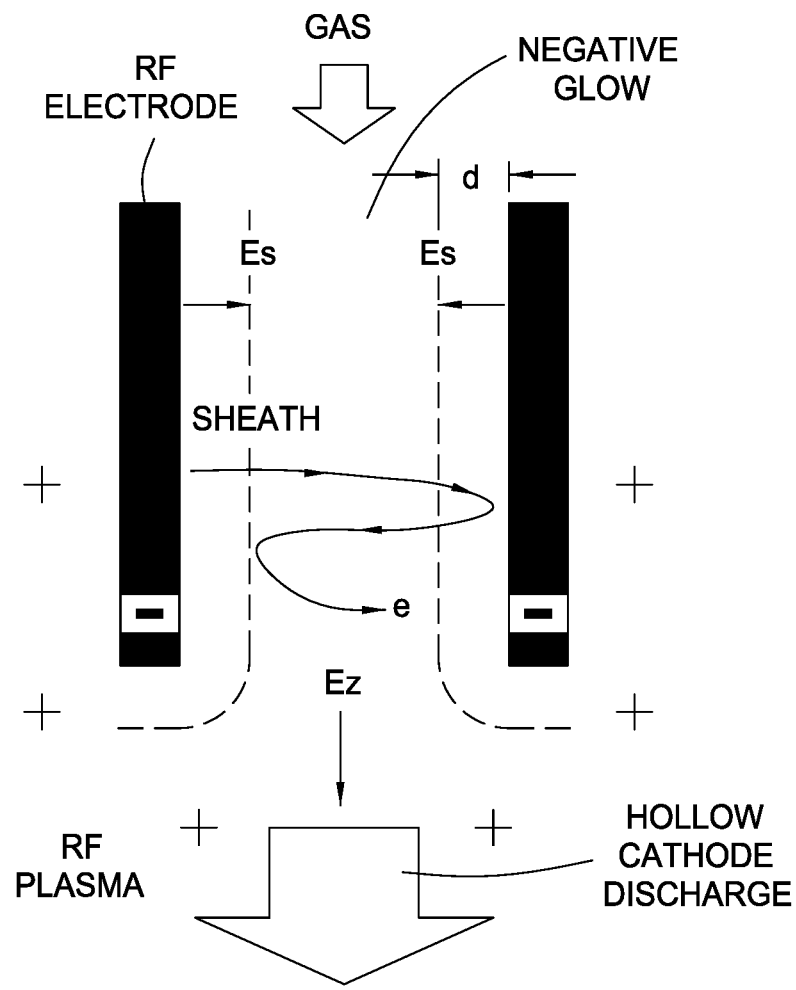
FIG. 6A (Prior Art) illustrates the concept of hollow cathode effect.
Figure 6C:
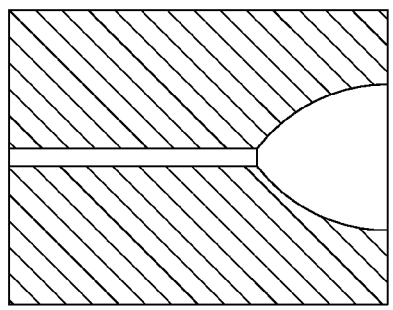
FIGS. 6B-6G illustrates various designs of hollow cathode cavities.
Figure 6F:
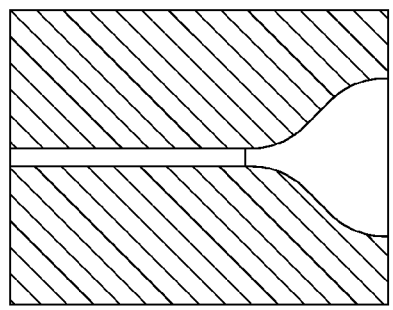
Figure 6B:
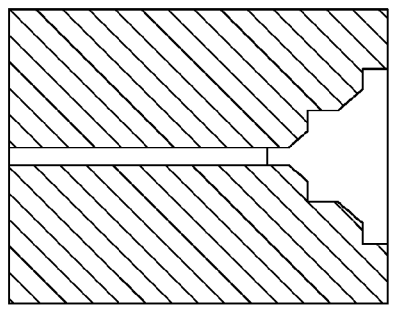
Figure 6E:
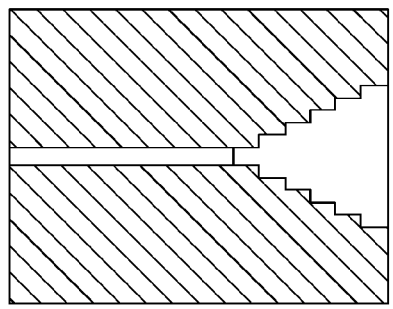
Figure 6D:
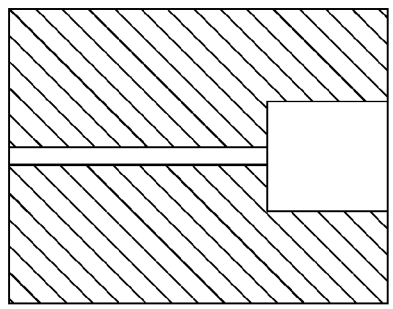
Figure 6G:
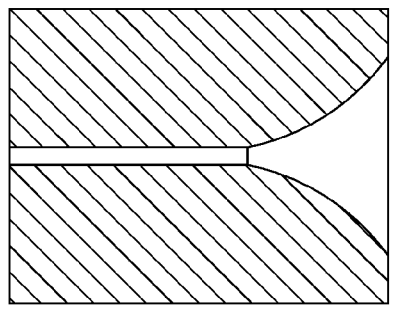

Another possible cause for the center to edge non-uniformity is plasma non-uniformity. Deposition of films by PECVD depends substantially on the source of the active plasma. Dense chemically reactive plasma can be generated due to hollow cathode effect. The driving force in the RF generation of a hollow cathode discharge is the frequency modulated d.c. voltage Vs (the self-bias voltage) across the space charge sheath at the RF electrode. A RF hollow cathode and oscillation movement of electrons between repelling electric fields, Es, of the opposite sheaths are shown schematically in FIG. 6A. An electron emitted from the cathode wall, which could be the walls of the reactive gas passages that are close to the process volume 212, is accelerated by the electric field Es across the wall sheath "☐". The electron oscillates across the inner space between walls of the electrode owing to the repelling fields of the opposite wall sheaths. The electron loses energy by collisions with the gas and creates more ions. The created ions can be accelerated to the cathode walls thereby enhancing emissions of secondary electrons, which could create additional ions. Overall, the cavities between the cathode walls enhance the electron emission and ionization of the gas. Flared-cone shaped cathode walls, with gas inlet diameter smaller than the gas outlet diameter, are more efficient in ionizing the gas than cylindrical walls. The potential Ez is created due to difference in ionization efficiency between the gas inlet and gas outlet.

By changing the design of the walls of the hollow cathode cavities, which faces the substrate and are at the downstream ends of the gas diffuser holes (or passages), that are close to the process volume 212 and the arrangement (or density) of the hollow cathode cavities, the gas ionization could be modified to control the film thickness and property uniformity. An example of the walls of the hollow cathode cavities that are close to the process volume 212 is the second bore 312 of FIG. 3. The hollow cathode effect mainly occurs in the flared cone 312 that faces the process volume 212. The FIG. 3 design is merely used as an example. The invention can be applied to other types of hollow cathode cavity designs. Other examples of hollow cathode cavity design include, but not limited to, the designs shown in FIGS. 6B-6G. By varying the volume and/or the surface area of the hollow cathode cavity, the plasma ionization rate can be varied.

Figure 7E:
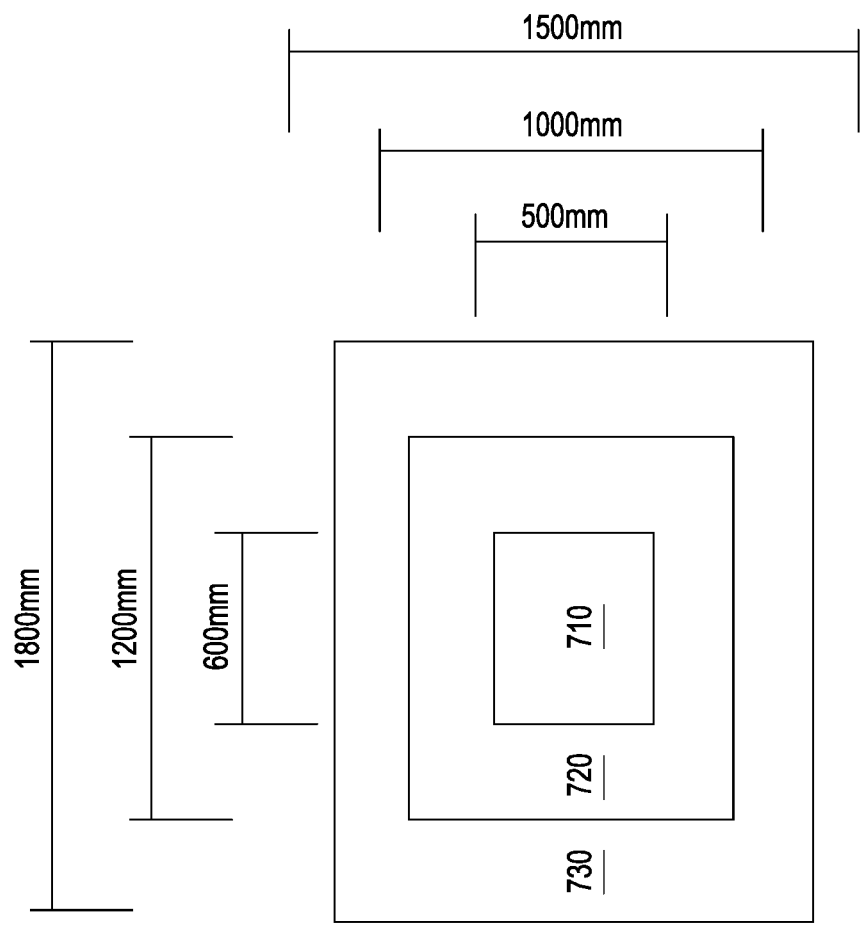
FIG. 7E shows the distribution of gas passages across a diffuser plate.
Figure 7A:
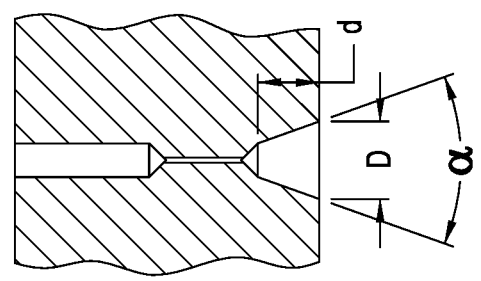
FIG. 7A shows the definition of diameter "D", the depth "d" and the flaring angle "□" of the bore that extends to the downstream end of a gas passage.
Figure 7D:
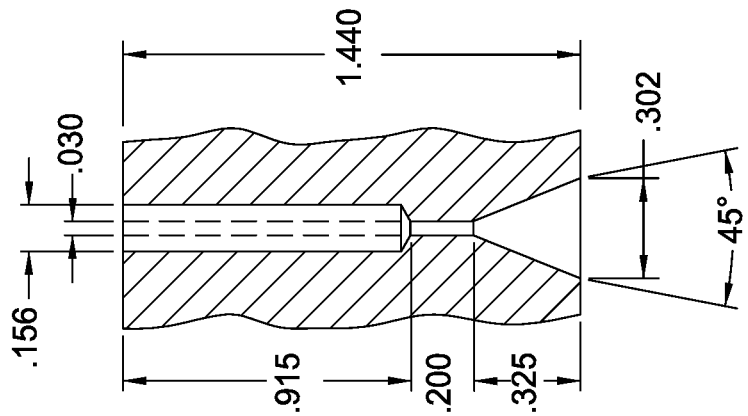
FIG. 7D shows the dimensions of a gas passage.
Figure 7C:
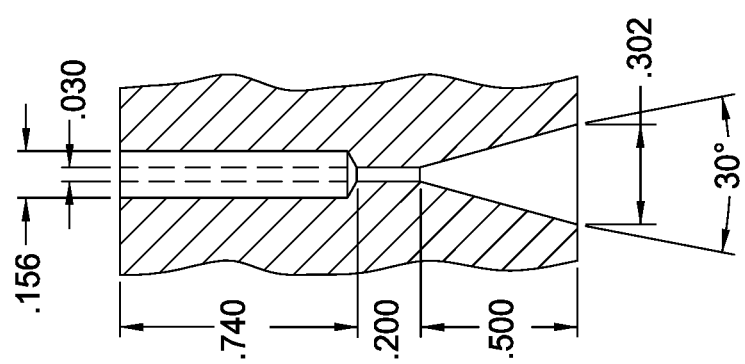
FIG. 7C shows the dimensions of a gas passage.
Figure 7B:
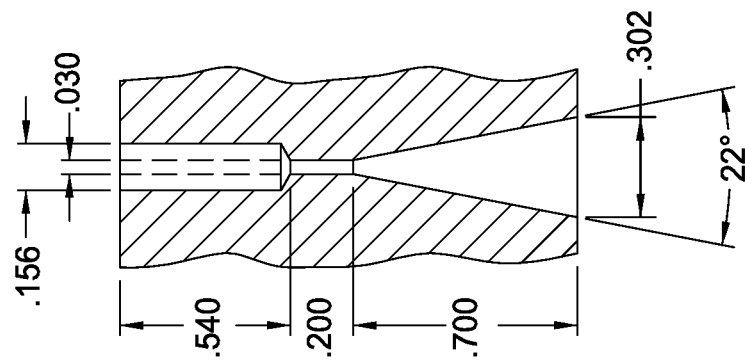
FIG. 7B shows the dimensions of a gas passage.

Using the design in FIG. 3 as an example, the volume of second bore (or hollow cathode cavity) 312 can be changed by varying the diameter "D" (or diameter 336 in FIG. 3), the depth "d" (or length 332 in FIG. 3) and the flaring angle "α" (or flaring angle 316 of FIG. 3), as shown in FIG. 7A. Changing the diameter, depth and/or the flaring angle would also change the surface area of the bore 312. Since the center of substrate has higher deposition rate and is more compressive, higher plasma density is likely the cause. By reducing the bore depth, the diameter, the flaring angle, or a combination of these three parameters from edge to center of the diffuser plate, the plasma density could be reduced in the center region of the substrate to improve the film thickness and film property uniformities. Reducing the cone (or bore) depth, cone diameter, flaring angle also reduces the surface area of the bore 312. FIGS. 7B, 7C and 7D show 3 diffuser passage (or diffuser hole) designs that are arranged on a diffuser plate shown in FIG. 7E. FIGS. 7B, 7C and 7D designs have the same cone (or bore) diameter, but the cone (or bore) depth and total cone (bore) surface areas are largest for FIG. 7B design and smallest for FIG. 7D design. The cone flaring angles have been changed to match the final cone diameter. The cone depth for FIG. 7B is 0.7 inch. The cone depth for FIG. 7C is 0.5 inch and the cone depth for FIG. 7D is 0.325 inch. The smallest rectangle 710 in FIG. 7E is 500 mm by 600 mm and the diffuser holes have cone depth 0.325 inch, cone diameter 0.302 inch and flare angel 45° (See FIG. 7D). The medium rectangle in FIG. 7E is 1000 mm by 1200 mm. The diffuser holes in the area 720 between the medium rectangle and the smallest rectangle have cone depth 0.5 inch, cone diameter 0.302 inch and flare angle 30° (See FIG. 7C). The largest rectangle in Figure is 1500 mm by 1800 mm. The diffuser holes in the area 730 between the largest rectangle and the medium rectangle have cone depth 0.7 inch, cone diameter 0.302 inch and flare angle 22° (See FIG. 7B) The orifice holes diameters are all 0.03 inch and holes depths are all 0.2 inch for FIGS. 7B, 7C and 7D. The thickness of the three diffuser plates are all 1.44 inch. The diameters for first bore 310 of FIGS. 7B, 7C and 7D are all 0.156 inch and the depth are 0.54 inch (FIG. 7B), 0.74 inch (FIG. 7C) and 0.915 inch (FIG. 7C) respectively.

Figure 8:
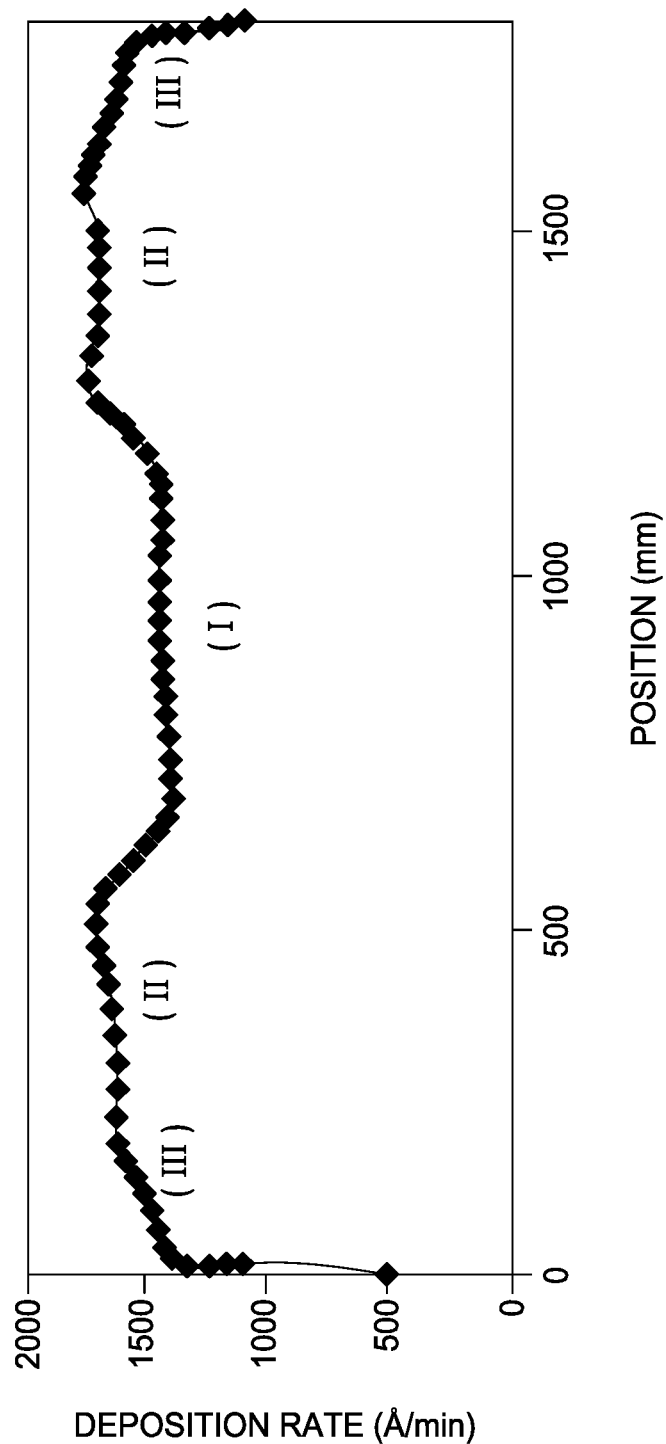
FIG. 8 shows the deposition rate measurement across a 1500 mm by 1800 mm substrate collected from deposition with a diffuser plate with a distribution of gas passages across the diffuser plate as shown in FIG. 7E.

FIG. 8 shows the deposition rate across the substrate. Region I correlates to the area under "0.325 inch depth" cones, while regions II and III correlates to "0.5 inch depth" (region II) and "0.7 inch depth" (region III) respectively. Table 3 shows the measurement of film thickness and properties across the substrate. The SiN film in Table 3 is deposited using 3300 sccm SiH$_4$, 28000 sccm NH$_3$ and 18000 sccm N$_2$, under 1.3 Torr, and 11000 watts source power. The spacing between the diffuser plate and the support assembly is 0.6 inch. The process temperature is maintained at about 355° C. The locations 1, 2, 3, 4 and 5 are the same locations indicated in FIG. 5.

TABLE 3

SiN film thickness and property measurement with diffuser plate with 3 regions of varying cone depths.

| Position | Cone depth (inch) | Thickness (Å) | RI | Stress (E9 dynes/cm$^2$) | SiH (atomic %) |
|---|---|---|---|---|---|
| 1 | 0.7 | 6060 | 1.924 | −4.09 | 9.10 |
| 2 | 0.5 | 6631 | 1.921 | −5.49 | 9.66 |
| 3 | 0.325 | 5659 | 1.915 | −2.02 | 12.34 |
| 4 | 0.5 | 6956 | 1.916 | −5.45 | 9.37 |
| 5 | 0.7 | 6634 | 1.917 | −4.14 | 8.83 |

The results show that reducing the cone depth and cone surface area reduces the deposition rate. The results also show that reducing the volume and/or surface area of hollow cathode cavity reduces the deposition rate. The reduction of the plasma deposition rate reflects a reduction in plasma ionization rate. Since the change of cone depth and total cone surface area from region I to region II to region III is not smooth, the deposition rates across the substrate shows three regions. Regions I, II and III on the substrate match the diffuser holes regions 710, 720 and 730. This indicates that changing the hollow cathode cavity design can change the plasma ionization rate and also the importance of making the changes smooth and gradual.

Figure 9A:
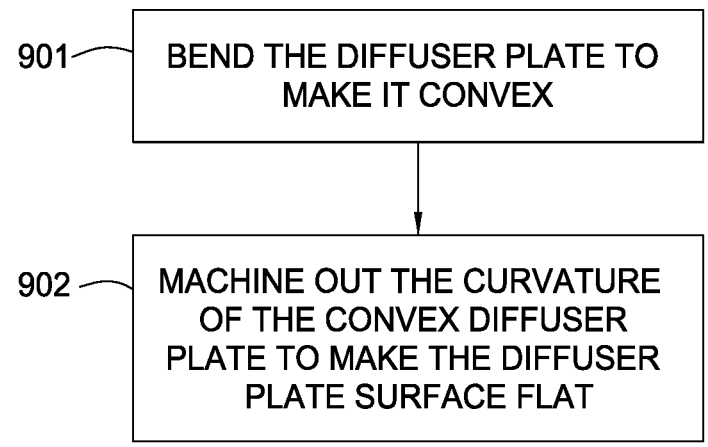
FIG. 9A shows the process flow of making a diffuser plate.
Figure 9B:
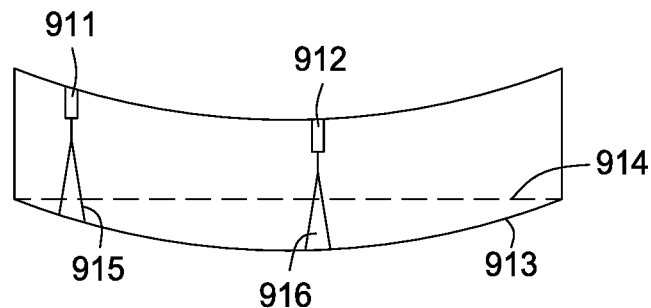
FIG. 9B shows a bent diffuser plate.
Figure 9C:
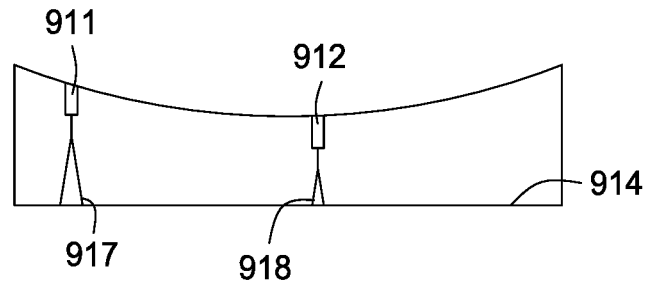
FIG. 9C shows a diffuser plate that was previously bent and the side that facing the downstream side was machined to be flat.

There are many ways to gradually change hollow cathode cavities from inner regions of the diffuser plate to the outer regions of the diffuser plate to improve plasma uniformity. One way is to first bend the diffuser plate, which has identical gas diffusing passages across the diffuser plate, to a pre-determined curvature and afterwards machine out the curvature to leave the surface flat. FIG. 9A shows the process flow of this concept. The process starts by bending the diffuser plate to make it convex at step 901, followed by machining out the curvature of the convex diffuser plate to make the diffuser plate surface flat at step 902. FIG. 9B shows a schematic drawing of a convex diffuser plate with an exemplary diffuser hole (or gas passage) 911 at the edge (and outer region) and an exemplary diffuser hole 912 in the center (and inner region) as diffuser holes. The diffuser holes 911 and 912 are identical before the bending process and are simplified drawings of diffuser holes as shown in FIGS. 3 and 7A. However, the invention can be used for any diffuser holes designs. The design in FIG. 3 is merely used for example. Diffuser plate downstream surface 304 faces the process volume 212. The gradual changing distance between the 913 surface and the flat 914 surface (dotted due to its non-existence) shows the curvature. The edge diffuser cone 915 and center diffuser cone 916 are identical in size and shape prior to the bending process. FIG. 9C shows the schematic drawing of a diffuser plate after the curvature has been machined out. The surface facing the process volume 212 is machined to 914 (a flat surface), leaving center cone 918 significantly shorter than the edge cone 917. Since the change of the cone size (volume and/or surface area) is created by bending the diffuser plate followed by machining out the curvature, the change of the cone size (volume and/or surface area) from center to edge is gradual. The center cone 918 would have diameter "D" and depth "d" smaller than the edge cone 917. The definition of cone diameter "D" and cone depth "d" can be found in the description of FIG. 7A.

Figure 9D:
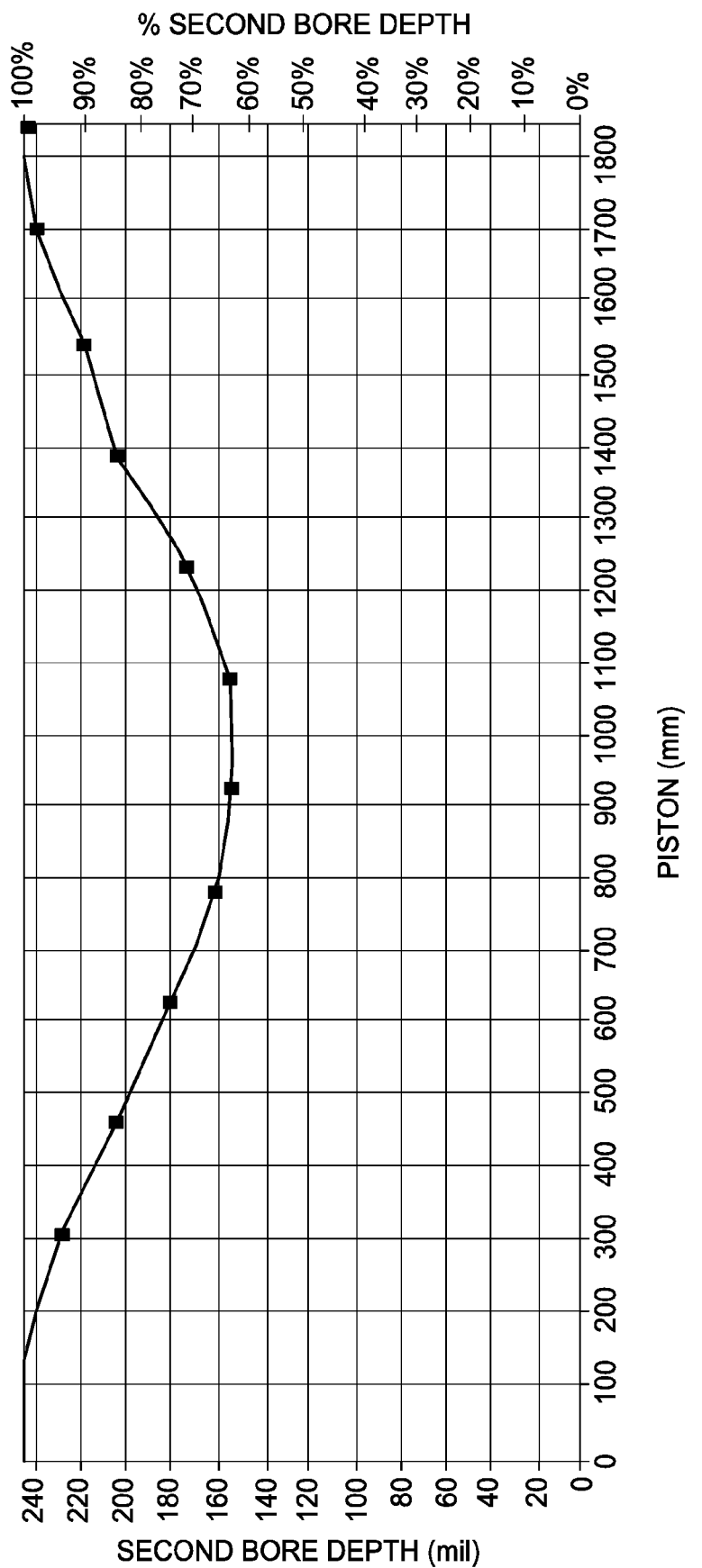
FIG. 9D shows the distribution of depths of diffuser bores that extends to the downstream ends of gas passages of a diffuser plate used to process 1500 mm by 1850 mm substrates.

FIG. 9D shows the depth "d" of the bores 312 (or cone) that extend to the downstream side of an exemplary diffuser plate, which is used to process 1500 mm by 1850 mm substrates. The diffuser plate has diffuser holes with design shown in FIG. 7A. The diameter of the first bore 310 is 0.156 inch. The length 330 of the first bore 310 is 1.049 inch. The diameter 336 of the second bore 312 is 0.250 inch. The flaring angle 316 of the second bore 312 is 22 degree. The length 332 of the second bore 312 is 0.243 inch. The diameter of the orifice hole 314 is 0.016 inch and the length 334 of the orifice hole 314 is 0.046 inch. The measurement of depths of the second bores in FIG. 9D shows a gradual increasing of bore depth 332 (or "d" in FIG. 7A) from center of the diffuser plate to the edge of the diffuser plate. Due to the bending and machining processes, the diameter 336 (or "D" in FIG. 7A) of the bore 312 also gradually increases from center of the diffuser plate to the edge of the diffuser plate.

Figure 9E:
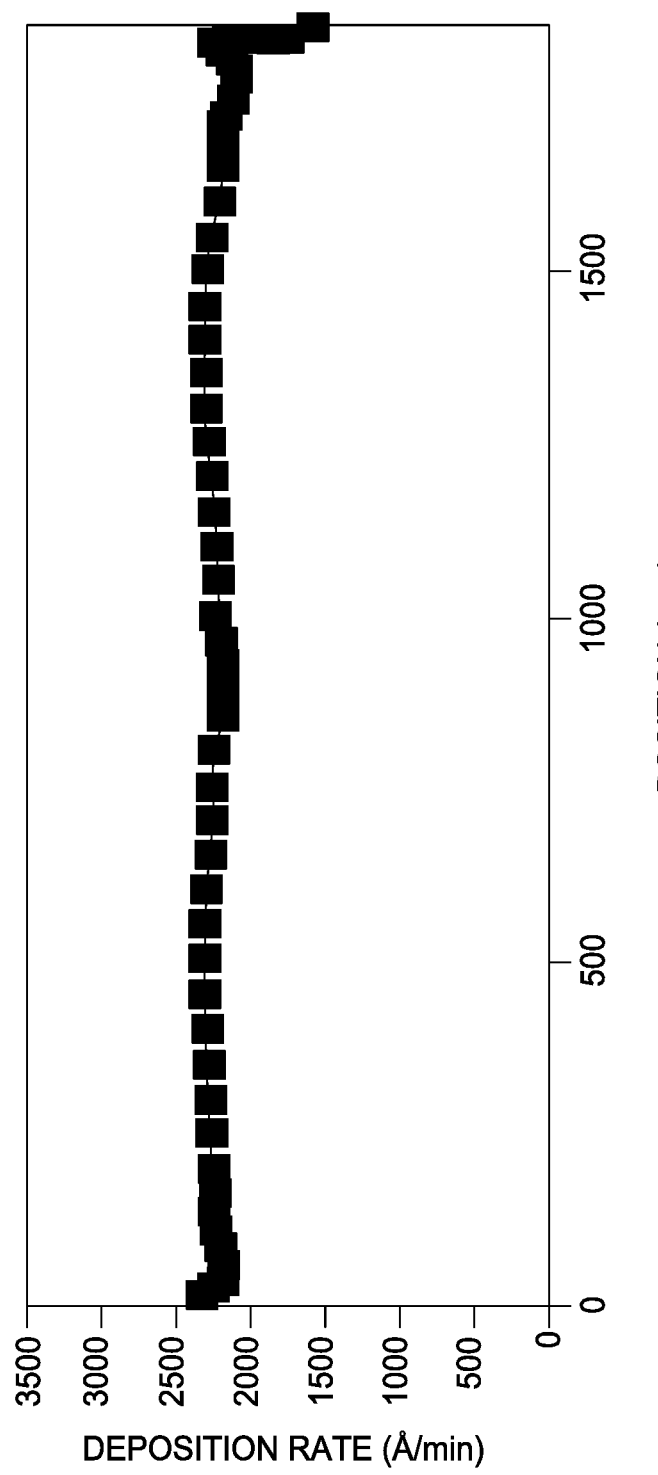
FIG. 9E shows the measurement of deposition rates across a 1500 mm by 1850 mm substrate.

FIG. 9E shows the thickness distribution across a substrate deposited with SiN film under a diffuser plate with a design described in FIGS. 9B, 9C and 9D. The size of substrate is 1500 mm by 1850 mm, which is only slightly larger than the size of substrate (1500 mm by 1800 mm) in FIG. 4B and Table 1. Typically, the diffuser plate sizes scale with the substrate sizes. The diffuser plate used to process 1500 mm by 1850 mm substrates is about 1530 mm by 1860 mm, which is slightly larger than the diffuser plate used to process 1500 mm by 1800 mm substrates (diffuser plate about 1530 mm by 1829 mm). The thickness uniformity is improved to 5.0%, which is much smaller than 25.1% for film in FIG. 4B. Table 4 shows the film property distribution across the substrate. The diffuser plate has diffuser holes with design shown in FIG. 7A. The diameter of the first bore 310 is 0.156 inch. The length 330 of the first bore 310 is 1.049 inch. The diameter 336 of the second bore 312 is 0.250 inch. The flaring angle 316 of the second bore 312 is 22 degree. The length 332 of the second bore 312 is 0.243 inch. The diameter of the orifice hole 314 is 0.016 inch and the length 334 of the orifice hole 314 is 0.046 inch. The SiN films in FIG. 9E and Table 4 are deposited using 2800 sccm SiH$_4$, 9600 sccm NH$_3$ and 28000 sccm N$_2$, under 1.5 Torr, and 15000 watts source power. The spacing between the diffuser plate and the support assembly is 1.05 inch. The process temperature is maintained at about 355° C. Edge I and Edge II represent two extreme ends of the substrate, as described in Table 1 measurement. The film thickness and property data in Table 4 show much smaller center to edge variation compared to the data in Table 1.

TABLE 4

SiN film thickness and property measurement using a diffuser plate with gradually varied bore depths and diameters from center to edge for a 1500 mm by 1850 mm substrate.

| Measurement location | Thickness (Å) | RI | Stress (E9 Dynes/cm$^2$) | Si-H (atomic %) | WER (Å/min) |
|---|---|---|---|---|---|
| Edge I | 6405 | 1.92 | −0.7 | 13.3 | 451 |
| Center | 6437 | 1.91 | −1.8 | 12.7 | 371 |
| Edge II | 6428 | 1.92 | −1.2 | 11.9 | 427 |

Comparing the data in Table 4 to the data in Table 1, which are collected from deposition with a diffuser plate with the same diameters and depths of bores 312 across the diffuser plate, the variation of thickness, stress, Si—H content and wet etch rate (WER) are all much less for the data in Table 4, which is collected from deposition with a diffuser plate with gradually increasing diameters and depths of bore 312 from the center to the edge of the diffuser plate. The results show that uniformity for thickness and film properties can be greatly improved by gradually increasing the diameters and depths of the bores, which extend to the downstream side of the diffuser plate, from center to edge.

The wet etch rates in the tables are measured by immersing the samples in a BOE 6:1 solution.

Figure 9F:
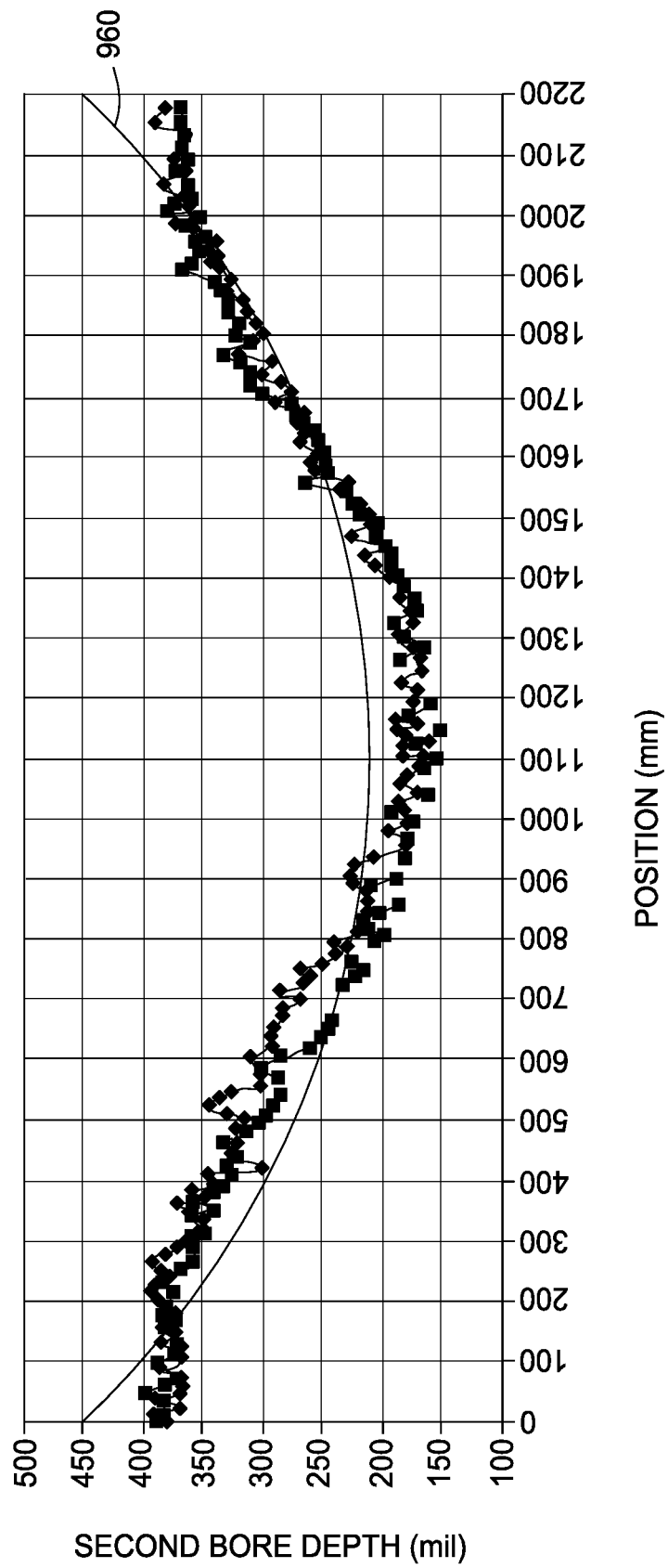
FIG. 9F shows the distribution of depths of diffuser bores that extends to the downstream ends of gas passages of a diffuser plate used to process 1870 mm by 2200 mm substrates.

FIG. 9F shows the depth "d" measurement of the bores 312 across an exemplary diffuser plate, which is used to process 1870 mm by 2200 mm substrates Curve 960 shows an example of an ideal bore depth distribution the diffuser plate. The measurement of depths of the bores in FIG. 9F shows a gradual increasing of bore depth from center of the diffuser plate to the edge of the diffuser plate. The downstream bore diameter would also gradually increase from center of the diffuser plate to the edge of the diffuser plate.

Figure 9G:
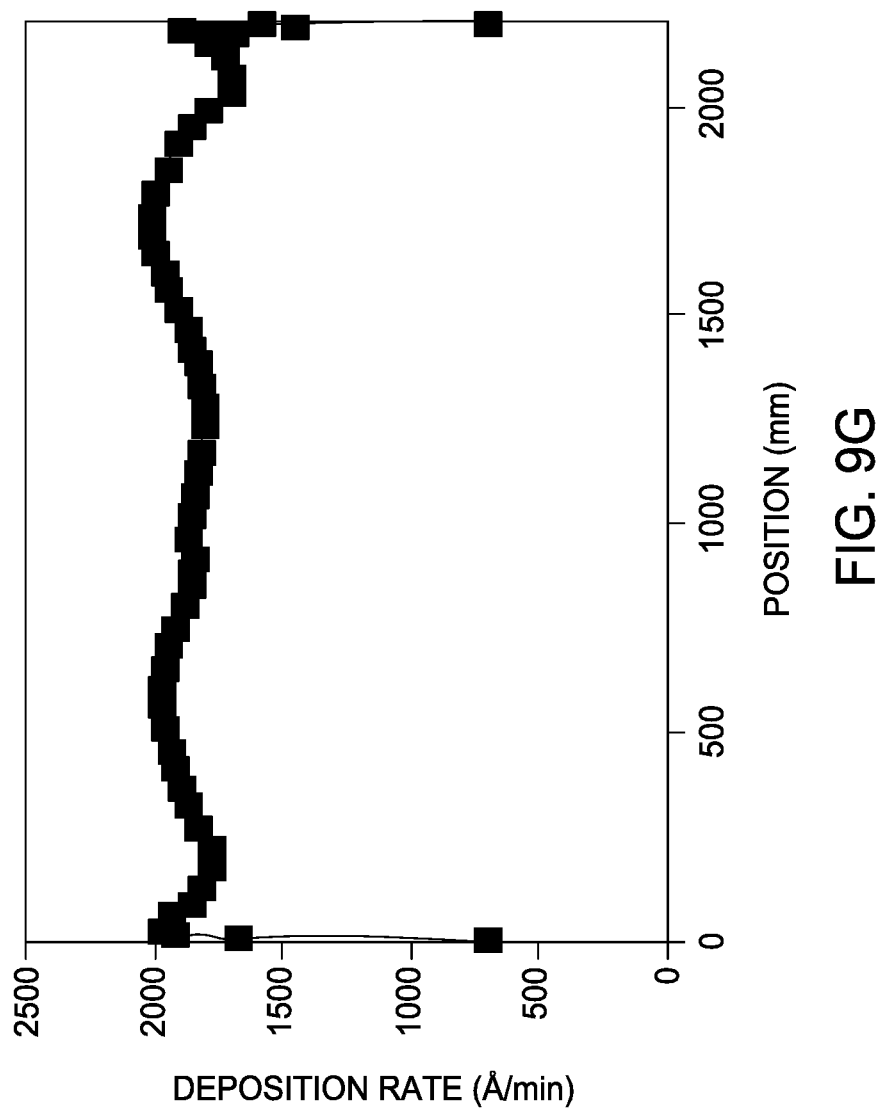
FIG. 9G shows the measurement of deposition rates across an 1870 mm by 2200 mm substrate.

FIG. 9G shows the thickness distribution across a substrate deposited with SiN film under a diffuser plate with a design similar to the one described in FIGS. 9B, 9C and 9F. The size of the substrate is 1870 mm by 2200 mm. Table 5 shows the film property distribution across the substrate. The diffuser plate has diffuser holes with design shown in FIG. 7A. The diameter of the first bore 310 is 0.156 inch. The length 330 of the first bore 310 is 0.915 inch. The diameter 336 of the second bore 312 is 0.302 inch. The flaring angle 316 of the second bore 312 is 22 degree. The length 332 of the second bore 312 is 0.377 inch. The diameter of the orifice hole 314 is 0.018 inch and the length 334 of the orifice hole 314 is 0.046 inch. The SiN films in Table 5 are deposited using 5550 sccm SiH$_4$, 24700 sccm NH$_3$ and 61700 sccm N$_2$, under 1.5 Torr, and 19000 watts source power. The spacing between the diffuser plate and the support assembly is 1.0 inch. The process temperature is maintained at about 350° C. Edge I and Edge II represent two extreme ends of the substrate, as described in Table 1 measurement. The film thickness and property data in Table 5 show much smaller center to edge variation compared to the data in Table 1. The thickness uniformity is 9.9%, which is much better than 25.1% for film in FIG. 4B. The data shown in FIG. 4B and Table 1 are film thickness and property data on smaller substrate (1500 mm by 1800 mm), compared to the substrate (1870 mm by 2200 mm) for data in FIG. 9G and Table 5. Thickness and property uniformities are expected to be worse for larger substrate. The uniformity of 9.9% and the improved film property data in Table 5 by the new design show that the new design, with gradual increasing diameters and depths of diffuser bores extended to the downstream side of the diffuser plate, greatly improves the plasma uniformity and process uniformity.

TABLE 5

SiN film thickness and property measurement using a diffuser plate with gradually varied bore depths and diameters from center to edge for an 1870 mm by 2200 mm substrate.

| Measurement location | Thickness (Å) | RI | Stress (E9 Dynes/cm$^2$) | Si-H (atomic %) | WER (Å/min) |
|---|---|---|---|---|---|
| Edge I | 5814 | 1.94 | −0.3 | 16.4 | 509 |
| Center | 5826 | 1.93 | 0.8 | 17.3 | 716 |
| Edge II | 5914 | 1.92 | −0.6 | 13.9 | 644 |

Although the exemplary diffuser plate described here is rectangular, the invention applies to diffuser plate of other shapes and sizes. One thing to note is that the convex downstream surface does not have to be machined to be completely flat across the entire surface. As long as the diameters and depths of the bores are increased gradually from center to edge of the diffuser plate, the edge of the diffuser plate could be left un-flattened.

Figure 10A:
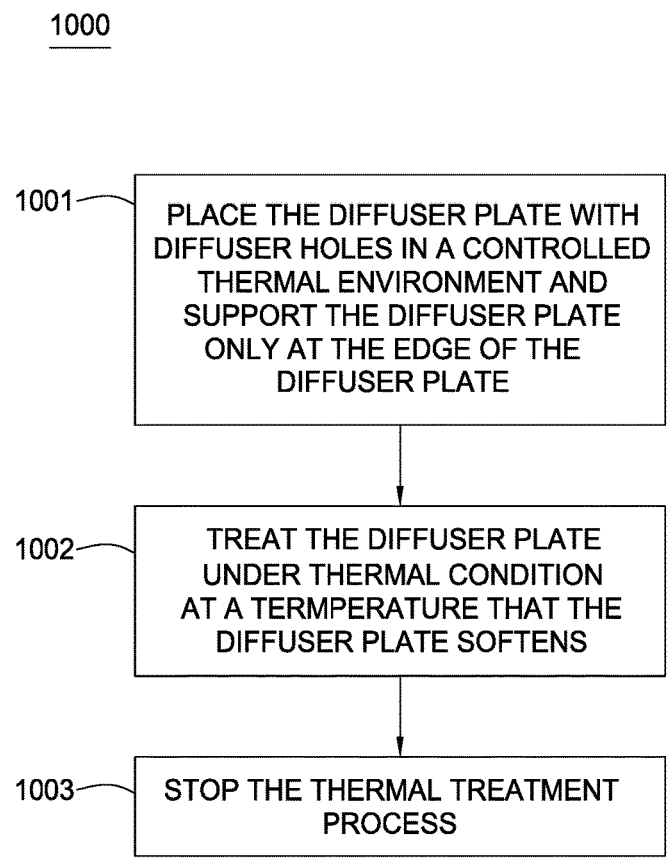
FIG. 10A shows the process flow of bending the diffuser plate by a thermal process.
Figure 10B:
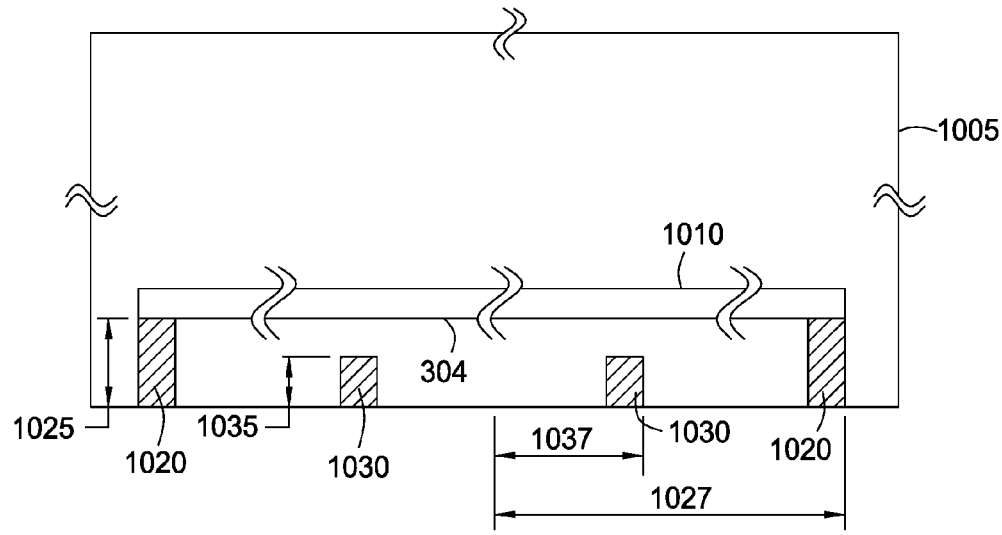
FIG. 10B shows the diffuser plate on the supports in the thermal environment that could be used to bend the diffuser plate.
Figure 10C:
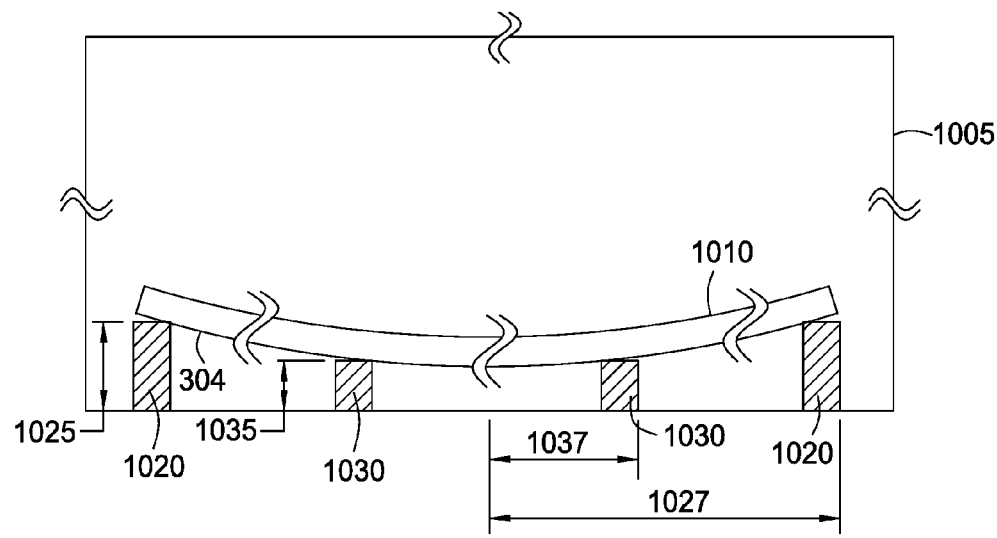
FIG. 10C shows the convex diffuser plate on the supports in the thermal environment.

There are also many ways to create curvature of the diffuser plate. One way is to thermally treat the diffuser plate at a temperature that the diffuser plate softens, such as a >400° C. temperature for aluminum, for a period of time by supporter only the edge of the diffuser plate. When the metal diffuser plate softens under the high temperature treatment, the gravity would pull center of the diffuser plate down and the diffuser plate would become curved. FIG. 10A shows the process flow 1000 of such thermal treatment. First, at step 1001 place the diffuser plate, which already has diffuser holes in it, in an environment 1005 or chamber that could be thermally controlled and place the diffuser plate 1010 on a support 1020 that only support the edge of the diffuser plate (See FIG. 10B). The diffuser plate facing down is the downstream surface 304 of the diffuser plate. Afterwards at step 1002, raise the temperature of the environment and treat the diffuser plate at a thermal condition at a temperature that the diffuser plate softens. One embodiment is to keep the thermal environment at a constant treatment temperature (iso-thermal), once the constant treatment temperature has been reached. After the curvature of the diffuser plate has reached the desired curvature, stop the thermal treatment process at step 1003. Note that in the thermal environment, optional diffuser support 1030 could be placed under diffuser plate 1010 at support height 1035 lower than the support height 1025 of support 1020 and at a support distance 1037 shorter than the support distance 1027 of support 1020. The optional support 1030 could help determine the diffuser curvature and could be made of elastic materials that could withstand temperature greater than 400° C. (the same temperature as the thermal conditioning temperature) and would not damage the diffuser plate surface. FIG. 10C shows that the curved diffuser plate 1010 resting on the diffuser plate supports 1020 and 1030 after the bending process.

Figure 11A:
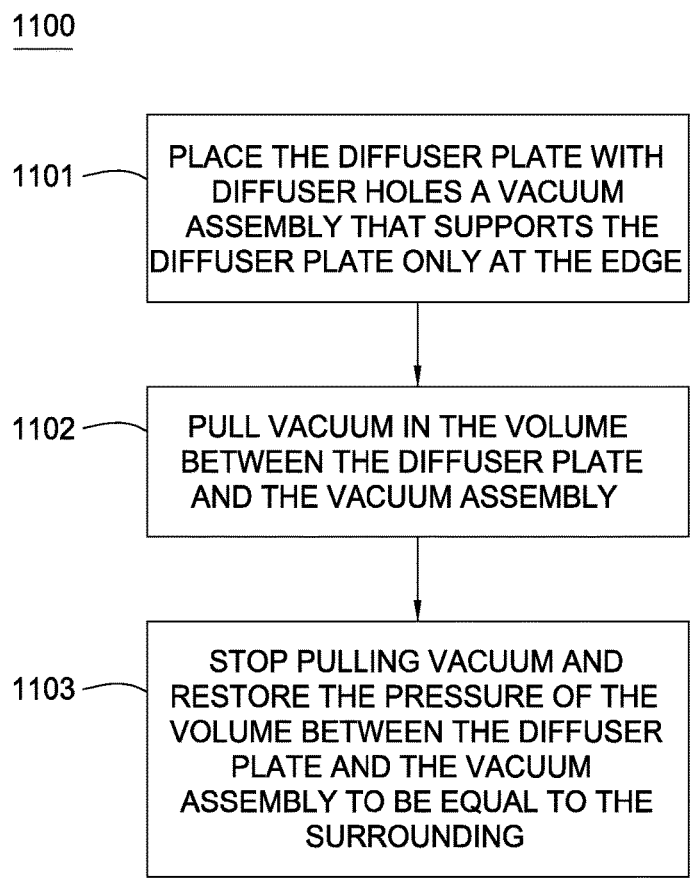
FIG. 11A shows the process flow of bending the diffuser plate by a vacuum process.
Figure 11B:
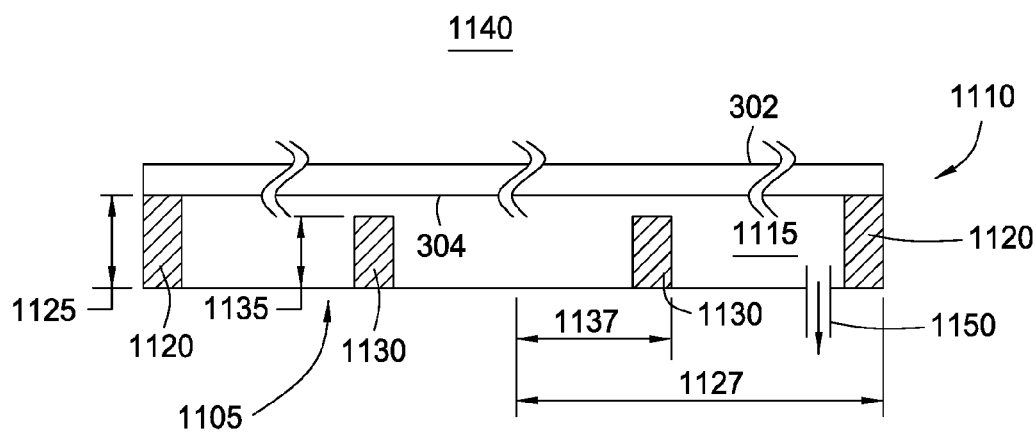
FIG. 11B shows the diffuser plate on the vacuum assembly.
Figure 11C:
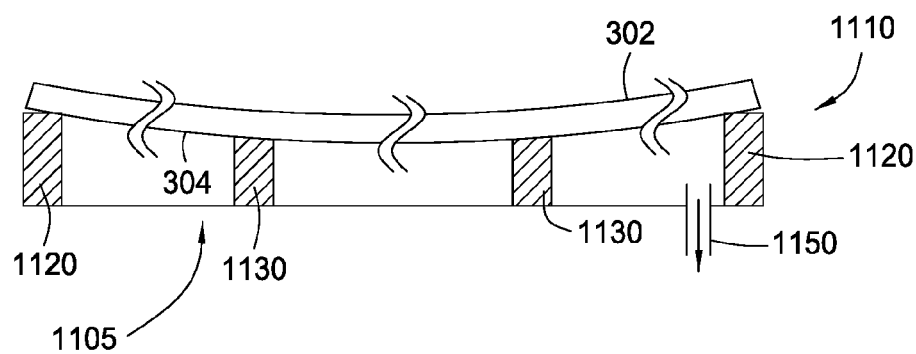
FIG. 11C shows the convex diffuser plate on the vacuum assembly.

Another way to create curvature is to use vacuum to smoothly bend the diffuser plate to a convex shape. FIG. 11A shows the process flow 1100 of such bending by vacuum process. First, at step 1101 place the diffuser plate, which already has diffuser holes in it and the downstream side 304 facing down, on a vacuum assembly 1105 and seal the upstream end 302 of the diffuser plate with a cover. The material used to cover (or seal) the upstream end of the diffuser plate must be strong enough to keep its integrity under vacuum. The vacuum assembly only supports the diffuser plate at the edge (See FIG. 11B) by diffuser plate holder 1120. The vacuum assembly 1105 is configured to have a pump channel 1150 to pull vacuum in the volume 1115 between the diffuser plate and the vacuum assembly 1105 when the upstream end of the diffuser plate is covered. The pumping channel 1150 in FIGS. 11B and 11C are merely used to demonstrate the concept. There could be more than one pumping channels placed at different locations in the vacuum assembly 1105. Afterwards at step 1102, pull vacuum in the volume 1115 between the diffuser plate and the diffuser plate holder. When the curvature of the diffuser plate has reached the desired curvature, stop the vacuuming process at step 1103 and restore the pressure of the volume 1115 between the diffuser plate and the vacuum assembly to be equal to the surrounding environment 1140 to allow the diffuser plate to be removed from the vacuum assembly 1105. Note that in the vacuum assembly, optional diffuser support 1130 could be placed under diffuser plate 1110 at support height 1135 lower than the support height 1125 of the diffuser plate support 1120 and at a support distance 1137 shorter than the support distance 1127 of support 1120. The optional support could help determine the diffuser curvature and could be made of materials, such as rubber, that would not damage the diffuser plate surface. FIG. 11C shows that the curved diffuser plate 1110 resting on the diffuser plate supports 1120 and 1130 after the bending process.

Figure 12A:
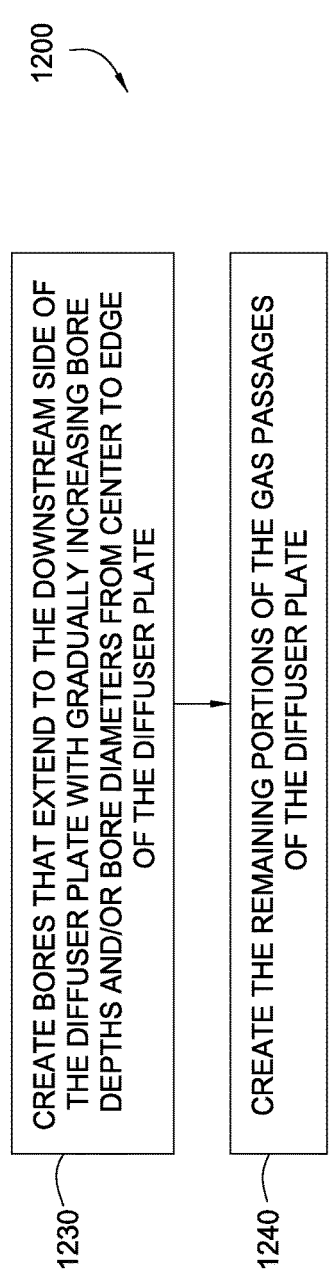
FIG. 12A shows the process flow of creating a diffuser plate with varying diameters and depths of bores that extends to the downstream side of the diffuser plate.
Figure 12B:
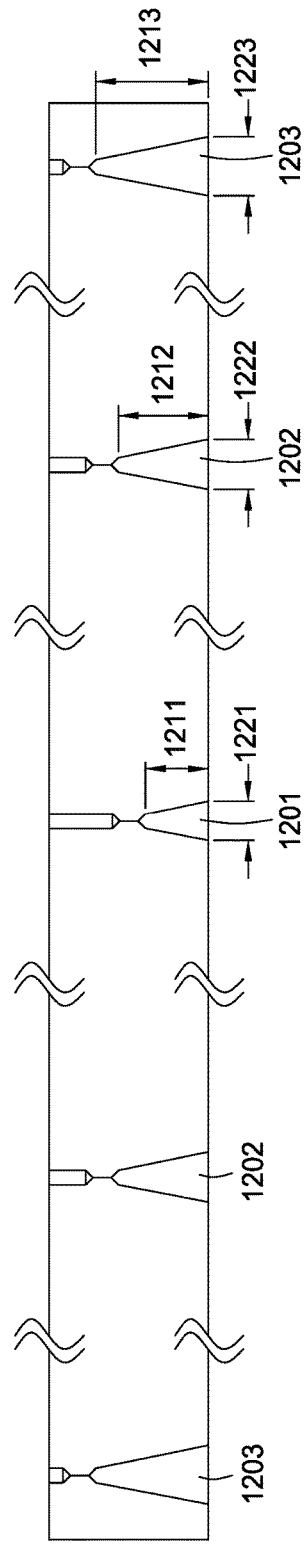
FIG. 12B shows the cross section of a diffuser plate with varying diameters and depths of bores that extends to the downstream side of the diffuser plate.

Another way to change the downstream cone (312 in FIG. 3) depth, cone diameter, cone flaring angle or a combination of these three parameters is by drilling the diffuser holes with varying cone depth, cone diameter or cone flaring angles from center of the diffuser plate to the edge of the diffuser plate. The drilling can be achieved by computer numerically controlled (CNC) machining. FIG. 12A shows the process flow of such a process 1200. The process 1200 starts at step 1230 by creating bores that extend to the downstream side of a diffuser plate with gradually increasing bore depths and/or bore diameters from center to edge of the diffuser plate. The flaring angle can also be varied from center to edge of the diffuser plate. Next at step 1240, the process is completed by creating the remaining portions of the gas passages of the diffuser plate. The downstream cones can be created by using drill tools. If drill tools with the same flaring angle are used across the diffuser plate, the cone flaring angles would stay constant and cone depth and cone diameter are varied. The cone diameter would be determined by the flaring angle and cone depth. The important thing is to vary the cone depth smoothly and gradually to ensure smooth deposition thickness and film property change across the substrate. FIG. 12B shows an example of varying cone depths and cone diameters. Diffuser hole 1201 is near the center of the diffuser plate and has the smallest cone depth 1211 and cone diameter 1221. Diffuser hole 1202 is between the center and edge of the diffuser plate and has the medium cone depth 1212 and cone diameter 1222. Diffuser hole 1203 is near the edge of the diffuser plate and has the largest cone depth 1213 and cone diameter 1223. The cone flaring angle of all diffuser holes are the same for the design in FIG. 12B. However, it is possible to optimize deposition uniformity by varying the cone design across the diffuser plate by varying both the cone diameters, cone depths and flaring angles. Changing the cone depth, cone diameter and cone flaring angle affects the total cone surface area, which also affects the hollow cathode effect. Smaller cone surface area lowers the plasma ionization efficiency.

Figure 12C:
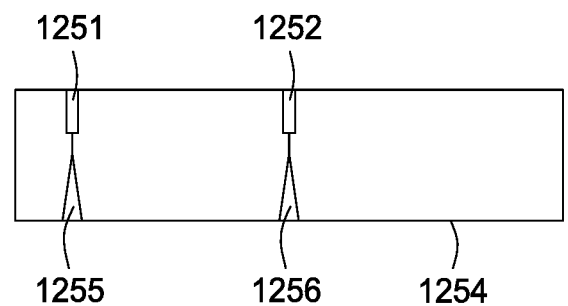
FIG. 12C shows a diffuser plate with substantially identical diffuser holes from center to edge of the diffuser plate.
Figure 12D:
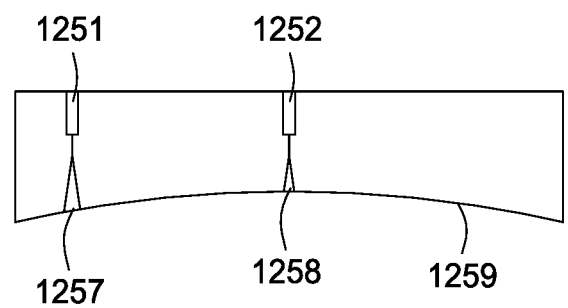
FIG. 12D shows the diffuser plate of FIG. 12C after the bottom surface has been machined into a concave shape.
Figure 12E:
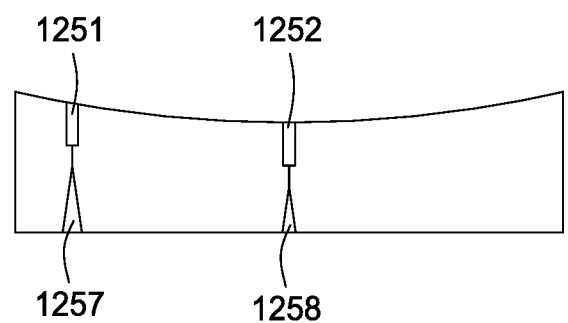
FIG. 12E shows the diffuser plate of FIG. 12D after its bottom surface has been pulled substantially flat.

Yet another way to change the downstream bore (312 in FIG. 3) depth ("d"), and bore diameter ("D") is by drilling identical diffuser holes across the diffuser plate (see FIG. 12C). In FIG. 12C, the gas diffuser hole 1251 at the edge (at outer region) of the diffuser plate is identical to the gas diffuser hole 1252 at the center (at inner region) of the diffuser plate. The downstream bore 1255 is also identical to downstream bore 1256. The downstream surface 1254 of gas diffuser plate is initially flat. Afterwards, machine downstream side of the diffuser plate to make a concave shape with center thinner than the edge. The machining can be achieved by computer numerically controlled machining or other types of controlled machining to make the machining process repeatable. After machining the downstream surface 1254 to a concave shape (surface 1259), the downstream bore 1258 at the center (an inner region) of the diffuser plate has smaller diameter ("D") and smaller length ("d") than the downstream bore 1257 at the edge (an outer region) of the diffuser plate. The diffuser plate can be left the way it is as in FIG. 12D, or downstream surface 1259 can be pulled flat as shown in FIG. 12E, or to other curvatures (not shown), to be used in a process chamber to achieve desired film results.

Figure 12F:
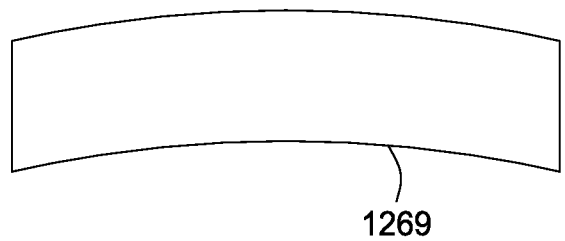
FIG. 12F shows a diffuser plate, without any diffuser holes, that has been bent into a concave (bottom surface) shape.
Figure 12G:
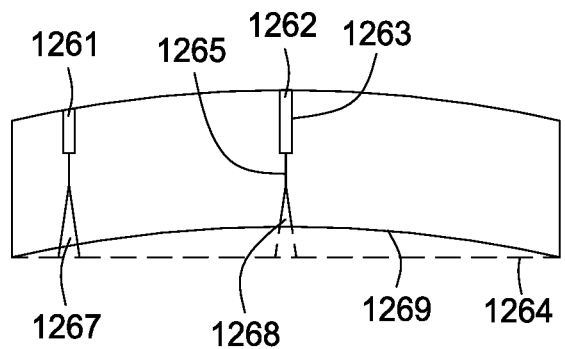
FIG. 12G shows the diffuser plate of FIG. 12F with diffuser holes.
Figure 12H:
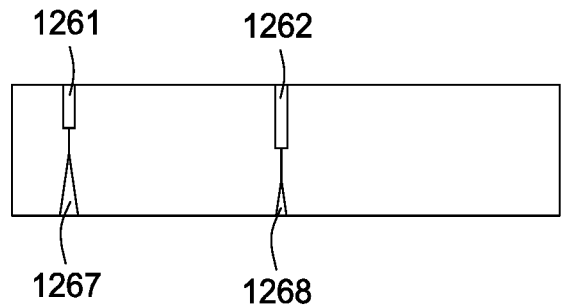
FIG. 12H shows the diffuser plate of FIG. 12G after its bottom surface has been pulled substantially flat.

Yet another way to change the downstream bore (312 in FIG. 3) depth ("d"), and bore diameter ("D") is by bending the diffuser plate without any diffuser hole into concave shape (See FIG. 12F). In FIG. 12F, the downstream surface is surface 1269. Afterwards, drill the downstream bores to the same depth using the same type of drill from a fictitious flat surface 1264 (See FIG. 12G). Although downstream bore 1268 at the center of the diffuser plate is drilled to the same depth from the fictitious surface 1264 as the downstream bore 1267, the diameter and length of the downstream bore 1268 are smaller than the diameter and length of the downstream bore 1267. The rest of the diffuser holes, which include orifice holes 1265, upstream bores 1263, and connecting bottoms, are machined to complete the diffuser holes. All orifice holes and upstream bores should have identical diameters, although it is not necessary. The diameters and lengths of the orifice holes should be kept the same across the diffuser plate (as shown in FIG. 12G). The orifice holes controls the back pressure. By keeping the diameters and the lengths of the orifice holes the same across the diffuser plate, the back pressure, which affects the gas flow, can be kept the same across the diffuser plate. The diffuser plate can be left the way it is as in FIG. 12G, or downstream surface 1269 can be pulled flat as shown in FIG. 12H, or to other curvatures (not shown), to be used in a process chamber to achieve desired film results.

Figure 12I:
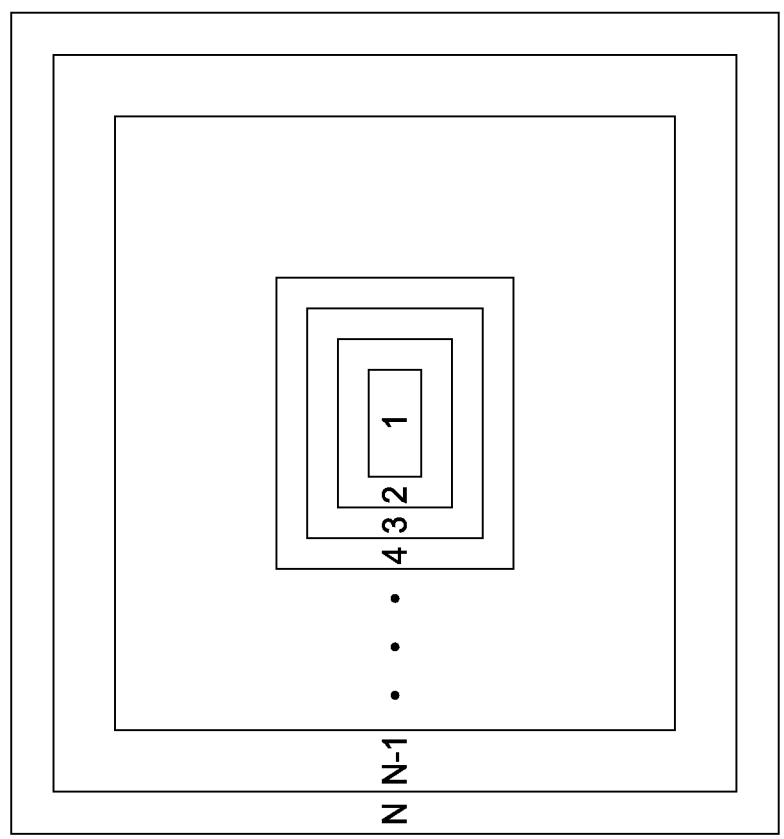
FIG. 12I shows a diffuser plate with diffuser holes in multiple zones.

The changes of diameters and/or lengths of the hollow cathode cavities do not have to be perfectly continuous from center of the diffuser plate to the edge of the diffuser plate, as long the changes are smooth and gradual. It can be accomplished by a number of uniform zones arranged in a concentric pattern as long as the change from zone to zone is sufficiently small. But, there need to be an overall increase of size (volume and/or surface area) of hollow cathode cavity from the center of the diffuser plate to the edge of the diffuser plate. FIG. 12I shows a schematic plot of bottom view (looking down at the downstream side) of a diffuser plate. The diffuser plate is divided into N concentric zones. Concentric zones are defined as areas between an inner and an outer boundaries, which both have the same geometric shapes as the overall shape of the diffuser plate. Within each zone, the diffuser holes are identical. From zone 1 to zone N, the hollow cathode cavity gradually increase in size (volume and/or surface area). The increase can be accomplished by increase of hollow cathode cavity diameter, length, flaring angle, or a combination of these parameters.

Figure 12J:
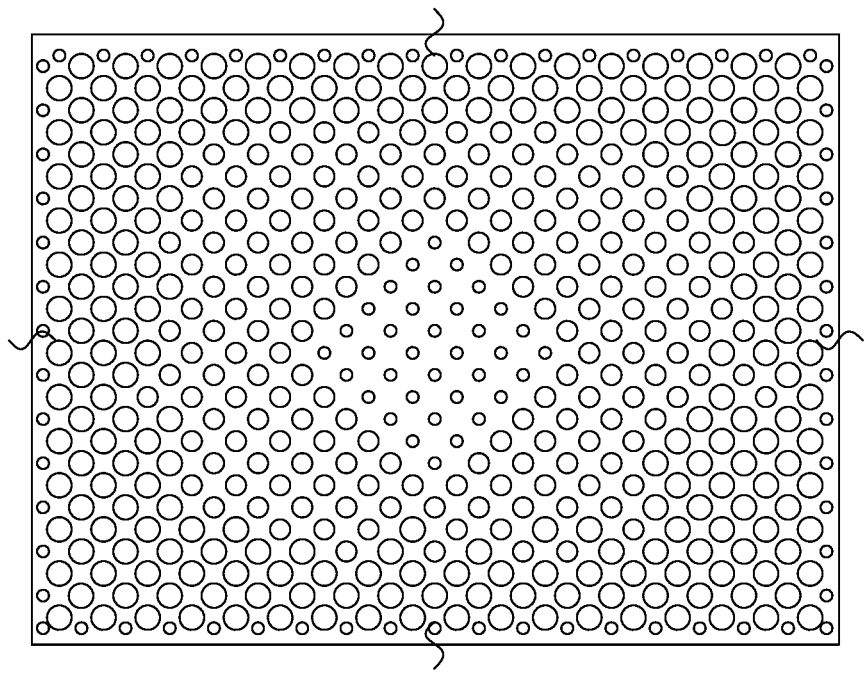
FIG. 12J shows a diffuser plate with mixed hollow cathode cavity diameters and the inner region hollow cathode cavity volume and/or surface area density is higher than the outer region hollow cathode cavity volume and/or surface area density.
Figure 12K:
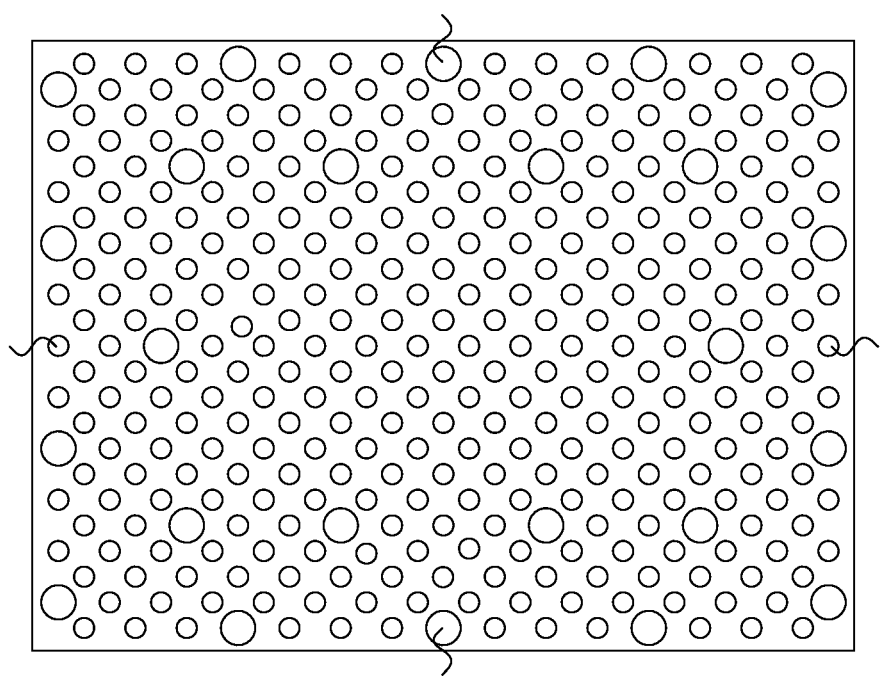
FIG. 12K shows a diffuser plate with most of the hollow cathode cavities the same, while there are a few larger hollow cathode cavities near the edge of the diffuser plate.

The increase of diameters and/or lengths of the hollow cathode cavities from center to edge of the diffuser plate also do not have to apply to all diffuser holes, as long as there is an overall increase in the size (volume and/or surface area) of hollow cathode cavities per downstream diffuser plate surface area of the hollow cathode cavities. For example, some diffuser holes could be kept the same throughout the diffuser plate, while the rest of the diffuser holes have a gradual increase in the sizes (volumes and/or surface areas) of the hollow cathode cavities. In another example, the diffuser holes have a gradual increase in sizes (volumes and/or surface areas) of the hollow cathode cavities, while there are some small hollow cathode cavities at the edge of the diffuser plate, as shown in FIG. 12J. Yet in another example, most of the hollow cathode cavities are uniform across the diffuser plate, while there are a few larger hollow cathode cavities towards the edge of the diffuser plate, as shown in FIG. 12K.

We can define the hollow cathode cavity volume density as the volumes of the hollow cathode cavities per downstream diffuser plate surface area of the hollow cathode cavities. Similarly, we can define the hollow cathode cavity surface area density of the hollow cathode cavity as the total surface areas of the hollow cathode cavities per downstream diffuser plate surface area of the hollow cathode cavities. The results above show that plasma and process uniformities can be improved by gradual increase in either the hollow cathode cavity volume density or the hollow cathode cavity surface area density of the hollow cathode cavities from the inner regions to the outer regions of the diffuser plate, or from center to edge of the diffuser plate.

Figure 13:
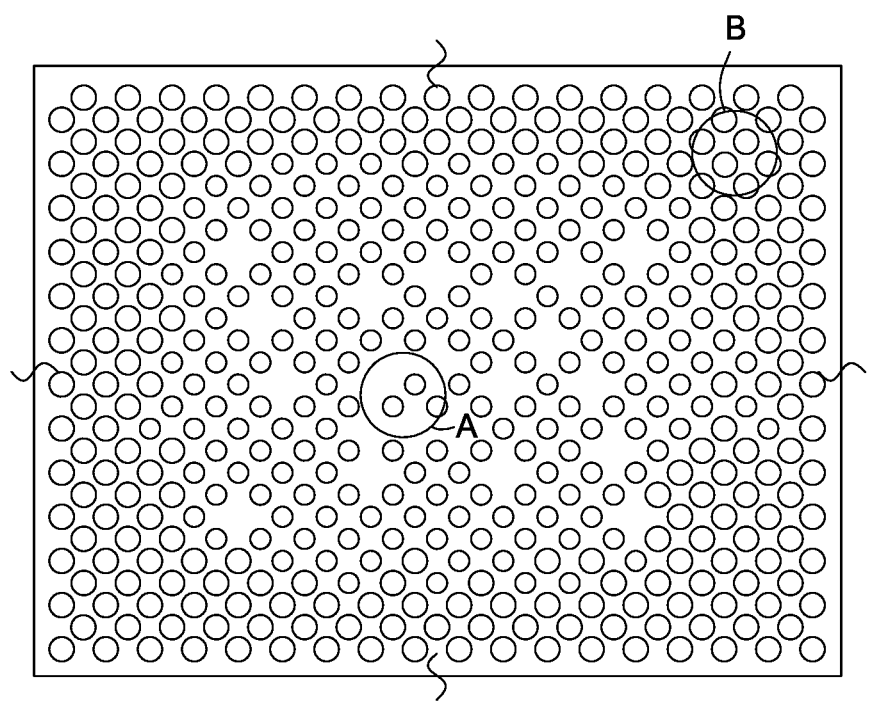
FIG. 13 shows the downstream side view of a diffuser plate with varying diffuser hole densities.

Another way to change the film deposition thickness and property uniformity is by changing the diffuser holes density across the diffuser plate, while keeping the diffuser holes identical. The density of diffuser holes is calculated by dividing the total surface of holes of bores 312 intersecting the downstream side 304 by the total surface of downstream side 304 of the diffuser plate in the measured region. The density of diffuser holes can be varied from about 10% to about 100%, and preferably varied from 30% to about 100%. To reduce the "dome shape" problem, the diffuser holes density should be lowered in the inner region, compared to the outer region, to reduce the plasma density in the inner region. The density changes from the inner region to the outer region should be gradual and smooth to ensure uniform and smooth deposition and film property profiles. FIG. 13 shows the gradual change of diffuser holes density from low in the center (region A) to high at the edge (region B). The lower density of diffuser holes in the center region would reduce the plasma density in the center region and reduce the "dome shape" problem. The arrangement of the diffuser holes in FIG. 3 is merely used to demonstrate the increasing diffuser holes densities from center to edge. The invention applies to any diffuser holes arrangement and patterns. The density change concept can also be combined with the diffuser hole design change to improve center to edge uniformity. When the density of the gas passages is varied to achieve the plasma uniformity, the spacing of hollow cathode cavities at the down stream end could exceed 0.6 inch.

The inventive concept of gradual increase of hollow cathode cavity size (volume and/or surface area) from the center of the diffuser plate to the edge of the diffuser plate can be accomplished by a combination of the one of the hollow cathode cavity size (volume and/or surface area) and shape variation, with or without the diffuser hole density variation, with one of the diffuser plate bending method, and with one of the hollow cathode cavity machining methods applicable. For example, the concept of increasing density of diffuser holes from the center to the edge of the diffuser plate can be used increasing the diameter of the hollow cathode cavity (or downstream bore) from the center to the edge of the diffuser plate. The diffuser plate could be kept flat and the diffuser holes are drilled by CNC method. The combination is numerous. Therefore, the concept is very capable of meeting the film thickness and property uniformity requirements.

Up to this point, the various embodiments of the invention are mainly described to increase the diameters and lengths of the hollow cathode cavities from center of the diffuser plate to the edge of the diffuser plate to improve the plasma uniformity across the substrate. There are situations that might require the diameter and the lengths of the hollow cathode cavities to decrease from the center of the diffuser plate to the edge of the diffuser plate. For example, the power source might be lower near the center of the substrate and the hollow cathode cavities need to be larger to compensate for the lower power source. The concept of the invention, therefore, applies to decreasing the sizes (volumes and/or areas) hollow cathode cavities from the center of the diffuser plate to the edge of the diffuser plate.

The concept of the invention applies to any design of gas diffuser holes, which includes any design of hollow cathode cavity, and any shapes/sizes of gas diffuser plates. The concept of the invention applies to a diffuser plate that utilizes multiple designs of gas diffuser holes, which include multiple designs of hollow cathode cavities. The concept of the invention applies to diffuser plate of any curvatures and diffuser plate made of any materials, for example, aluminum (Al), tungsten (W), chromium (Cr), tantalum (Ta), or combinations thereof, among others, and by any methods, for example, cast, brazed, forged, hot iso-statically pressed or sintered. The concept of the invention also applies to diffuser plate made of multiple layers of materials that are pressed or glued together. In addition, the concept of the invention can be used in a chamber that could be in a cluster system, a stand-alone system, an in-line system, or any systems that are applicable.

Although several preferred embodiments which incorporate the teachings of the present invention have been shown and described in detail, those skilled in the art can readily devise many other varied embodiments that still incorporate these teachings.

What is claimed is:

1. A method of depositing a thin film on a substrate, comprising:
    placing a substrate on a substrate support that is mounted in a processing region of a processing chamber;
    flowing a process fluid through a plurality of gas passages in a diffuser plate toward the substrate supported on the substrate support, wherein the diffuser plate has an upstream side and a downstream side and the downstream side has a substantially concave curvature, and each of the gas passages are formed between the upstream side and the downstream side, and wherein a portion of the plurality of gas passages include a cone shaped hole having a depth that varies from a center to an edge of the diffuser plate; and
    creating a plasma between the downstream side of the diffuser plate and the substrate support.

2. The method of claim 1, wherein a portion of the gas passages comprise a hollow cathode cavity in fluid communication with the downstream side.

3. The method of claim 1, wherein a volume, a surface area, or a density of each of the gas passages varies across the diffuser plate to obtain a desired thin film thickness and property uniformity.

4. The method of claim 1, wherein the diffuser plate is rectangular.

5. The method of claim 1, wherein the diffuser plate size is at least 1,200,000 mm².

6. The method of claim 1, wherein each of the gas passages comprise:
    an orifice hole having a first diameter; and
    a hollow cathode cavity that is downstream of and in fluid communication with the orifice hole and open at the downstream side.

7. The method of claim 6, wherein each of the gas passages further comprise a bore at the upstream side fluidly coupled to the orifice hole having a second diameter greater than the first diameter.

8. The method of claim 7, wherein each of the hollow cathode cavities have a third diameter at the downstream side that is greater than the second diameter.

9. The method of claim 8, wherein each of the third diameters of the hollow cathode cavities increases from the center to the edge of the diffuser plate.

10. The method of claim 9, wherein each of the first diameters are substantially uniform from the center to the edge of the diffuser plate.

11. The method of claim 6, wherein each of the hollow cathode cavities have a volume, a surface area, or a density of each of the gas passages that varies across the diffuser plate to obtain a desired thin film thickness and property uniformity.

12. A method of depositing a thin film on a substrate, comprising:
    placing a substrate between a substrate support and a diffuser plate that is mounted in a processing region of a processing chamber;
    flowing a process fluid through a plurality of gas passages such including a hollow cathode cavity formed in a downstream side of the diffuser plate toward the substrate supported on the substrate support, wherein the diffuser plate has an upstream side and the downstream side has a substantially concave curvature, and each of the hollow cathode cavities are fluidly coupled to a bore formed from the upstream side and wherein a portion of the plurality of hollow cathode cavities include a cone shaped hole having a depth that varies from a center to an edge of the diffuser plate; and
    creating a plasma between the downstream side of the diffuser plate and the substrate support.

13. The method of claim 12, wherein each of the gas passages further comprise an orifice hole positioned between the bore and the hollow cathode cavity.

14. The method of claim 13, wherein the orifice holes are configured uniformly among the gas passages.

15. The method of claim 13, wherein the orifice holes are configured non-uniformly among the gas passages.

16. A method of depositing a thin film on a substrate, comprising:
    placing a substrate between a substrate support and a diffuser plate that is mounted in a processing region of a processing chamber;
    flowing a process fluid through a plurality of gas passages formed between an upstream side and a downstream side of the diffuser plate toward the substrate supported on the substrate support, wherein each of the gas passages include:
        an orifice hole having a first diameter; and
        a hollow cathode cavity that is downstream of the orifice hole and is at the downstream side, the hollow cathode cavity having a cone or cylinder shape and a second diameter at the downstream side that is greater than the first diameter, the second diameters or the depths or a combination of both of the cones or cylinders increases from the center to the edge of the diffuser plate, and the first diameters are substantially uniform from the center to the edge of the diffuser plate; and
    creating a plasma between the downstream side of the diffuser plate and the substrate support.

17. The method of claim 16, wherein the downstream side of the diffuser plate is concave.

18. The method of claim 16, wherein the diffuser plate has a first thickness at the edge and a second thickness at the center.

19. The method of claim 16, wherein the orifice holes are configured uniformly among the gas passages.

20. The method of claim 16, wherein the orifice holes are configured non-uniformly among the gas passages.

* * * * *